(12) United States Patent
Ono et al.

(10) Patent No.: US 10,714,360 B2
(45) Date of Patent: Jul. 14, 2020

(54) METHOD FOR MANUFACTURING A MODULE AND AN OPTICAL MODULE

(71) Applicants: Tadashi Ono, Tokyo (JP); Makoto Kitazume, Tokyo (JP)

(72) Inventors: Tadashi Ono, Tokyo (JP); Makoto Kitazume, Tokyo (JP)

(73) Assignee: MINEBEA MITSUMI Inc., Nagano (JP)

( * ) Notice: Subject to any disclaimer, the term of this patent is extended or adjusted under 35 U.S.C. 154(b) by 0 days.

(21) Appl. No.: 16/357,741

(22) Filed: Mar. 19, 2019

(65) Prior Publication Data

US 2019/0304806 A1 Oct. 3, 2019

(30) Foreign Application Priority Data

Mar. 30, 2018 (JP) ................................ 2018-066933

(51) Int. Cl.
| | |
|---|---|
| H01L 21/56 | (2006.01) |
| H01L 23/29 | (2006.01) |
| H01L 23/31 | (2006.01) |
| H01L 23/00 | (2006.01) |
| H01L 33/50 | (2010.01) |
| H01L 33/54 | (2010.01) |
| H01L 33/56 | (2010.01) |
| H01L 33/48 | (2010.01) |

(52) U.S. Cl.
CPC ............... *H01L 21/56* (2013.01); *H01L 23/29* (2013.01); *H01L 23/31* (2013.01); *H01L 24/73* (2013.01); *H01L 33/486* (2013.01); *H01L 33/50* (2013.01); *H01L 33/54* (2013.01); *H01L 33/56* (2013.01); *H01L 2924/12041* (2013.01)

(58) Field of Classification Search
CPC ......... H01L 21/56; H01L 23/29; H01L 23/31; H01L 33/486; H01L 33/50; H01L 33/54; H01L 33/56; H01L 24/73
See application file for complete search history.

(56) References Cited

U.S. PATENT DOCUMENTS

| | | | |
|---|---|---|---|
| 8,753,907 B2 | 6/2014 | Shimomura et al. | |
| 2013/0299796 A1* | 11/2013 | Masuyama | B81C 1/00031 257/40 |
| 2014/0306213 A1* | 10/2014 | Sato | H01L 51/5072 257/40 |
| 2015/0014820 A1* | 1/2015 | Owada | H01L 29/0657 257/622 |

(Continued)

FOREIGN PATENT DOCUMENTS

JP 2013-004807 1/2013

*Primary Examiner* — Nathan W Ha
(74) *Attorney, Agent, or Firm* — IPUSA, PLLC

(57) ABSTRACT

A method for manufacturing a module including N layers of stacked resin is provided, wherein N is a natural number of two or more. In the method, resin of a first layer is cured to a degree that does not fully harden the resin of the first layer. Resin of a Mth layer is stacked on resin of a (M−1)th layer, wherein M is a natural number of two or more and less than N. The resin of the Mth layer is cured to a degree that does not fully harden the resin of the Mth layer. Stacking the resin of the Mth layer and curing the resin of the Mth layer are repeated. Then, resin of Nth layer is stacked, and all of the N layers of stacked resin are fully hardened.

13 Claims, 19 Drawing Sheets

(56) References Cited

U.S. PATENT DOCUMENTS

| | | | |
|---|---|---|---|
| 2016/0011689 A1* | 1/2016 | Kim | G06F 3/045 |
| | | | 345/173 |
| 2016/0337561 A1* | 11/2016 | Park | H04N 5/2253 |
| 2017/0357113 A1* | 12/2017 | Yamazaki | G02F 1/1335 |
| 2018/0223061 A1* | 8/2018 | Hattori | B32B 5/18 |
| 2018/0286829 A1* | 10/2018 | Akaike | C09J 183/04 |
| 2018/0309073 A1* | 10/2018 | Nakamura | G02B 27/095 |

* cited by examiner

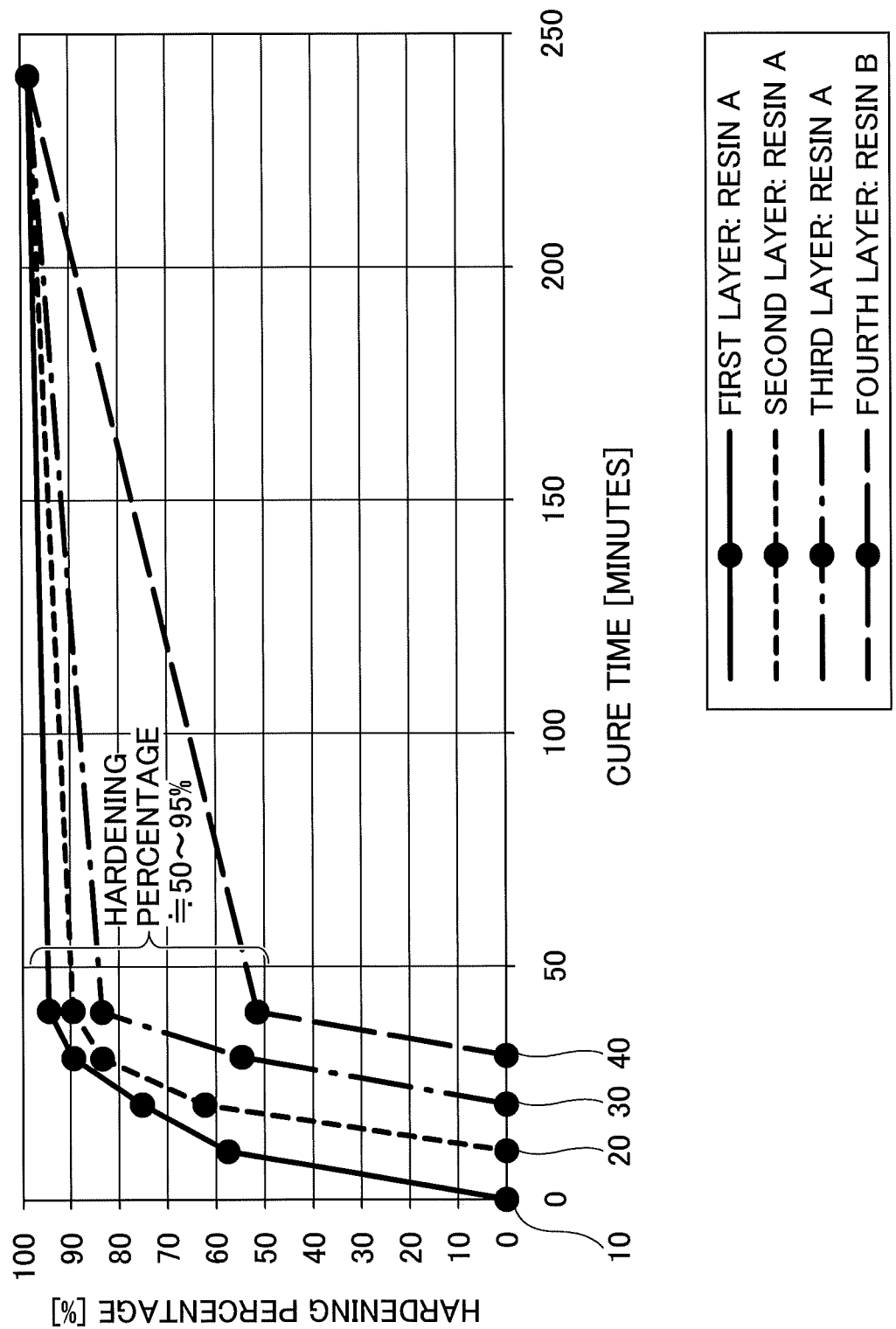

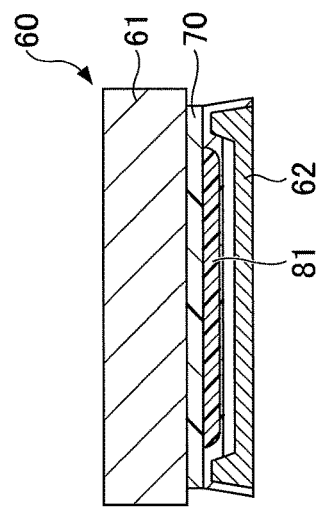
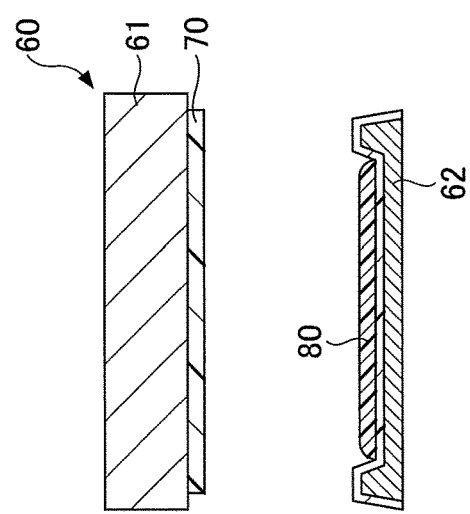
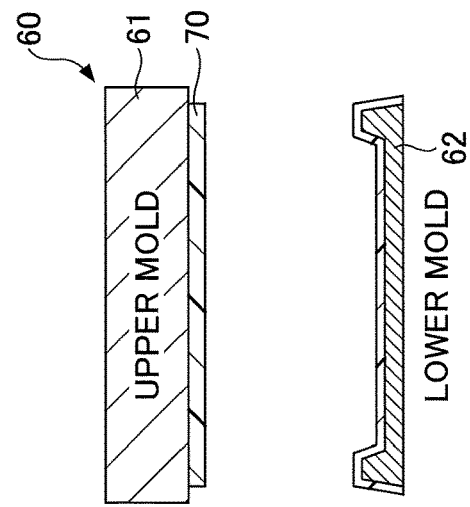

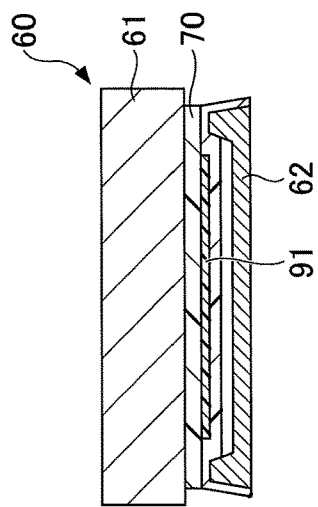
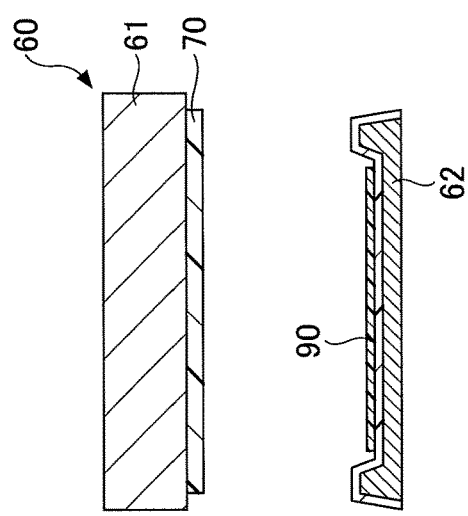
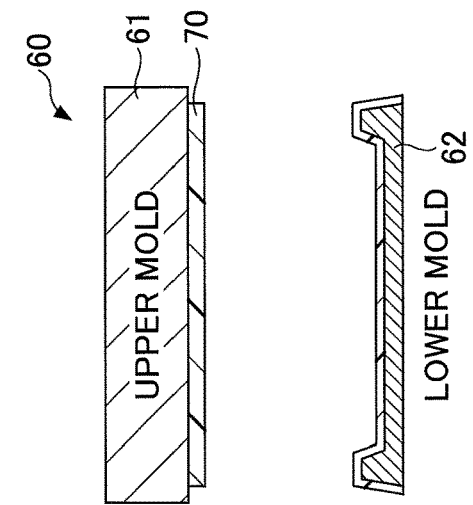

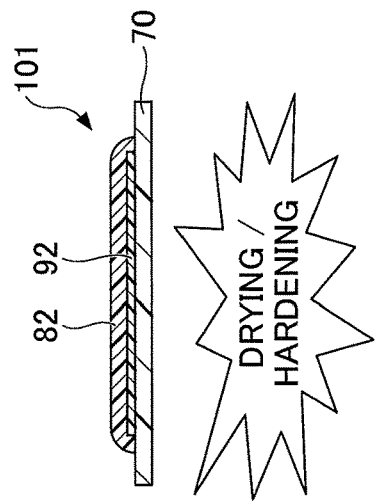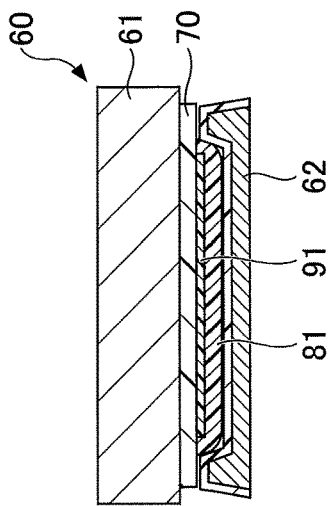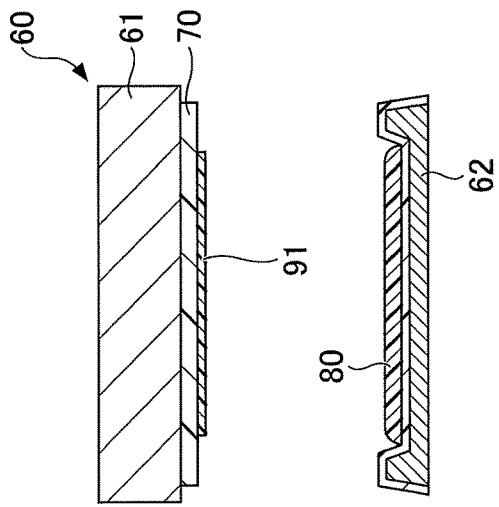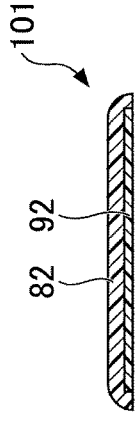

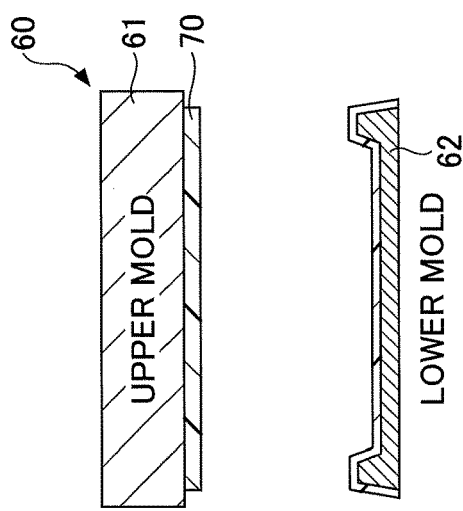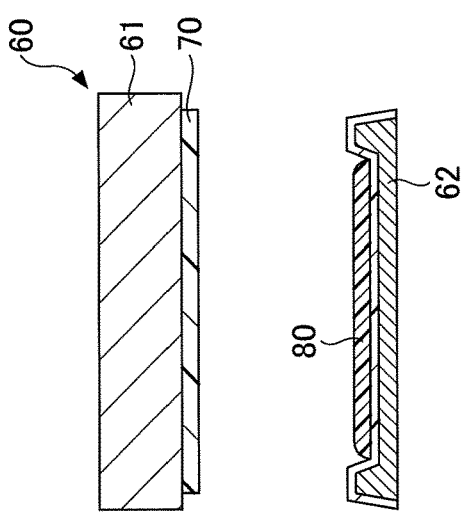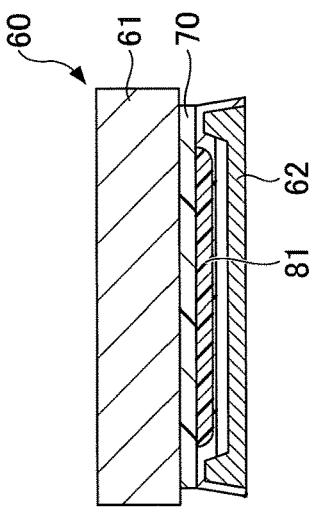

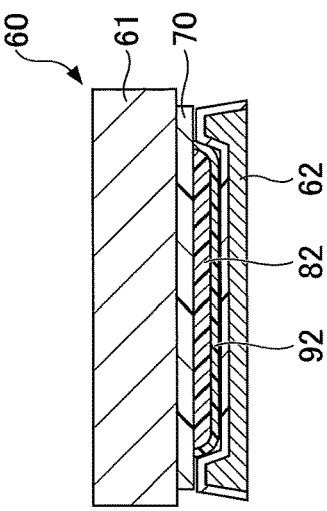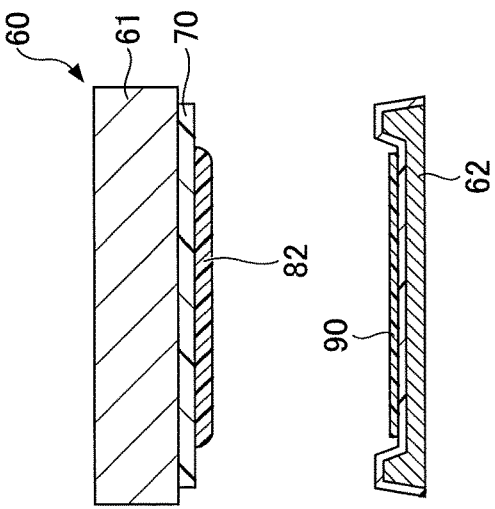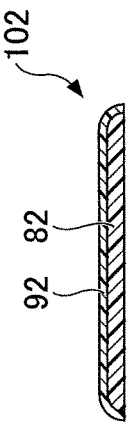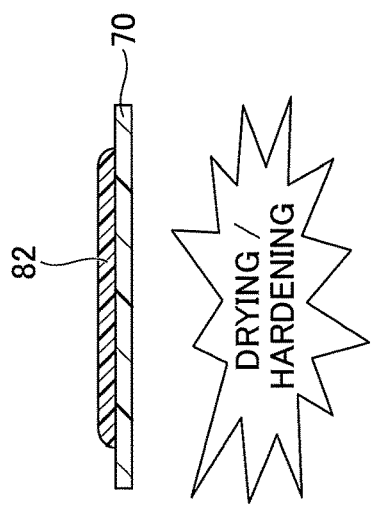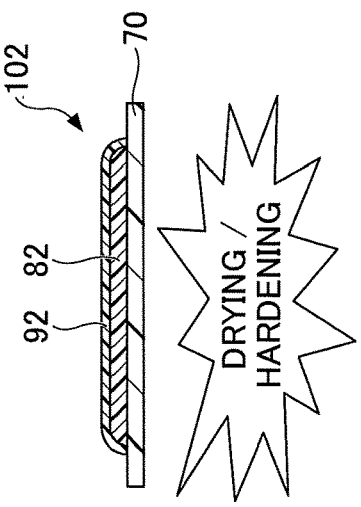

METHOD FOR MANUFACTURING A MODULE AND AN OPTICAL MODULE

CROSS-REFERENCE TO RELATED APPLICATION

The present application is based on and claims priority to Japanese Priority Application No. 2018-066933 filed on Mar. 30, 2018, the entire contents of which are hereby incorporated herein by reference.

BACKGROUND OF THE INVENTION

1. Field of the Invention

The present disclosure relates to a method for manufacturing a module and an optical module.

2. Description of the Related Art

Conventionally, as described in Japanese Laid-Open Patent Application Publication No. 2013-4807, a method for manufacturing a semiconductor light emitting device is known that includes a first frame to which a light emitting element is attached, a second frame disposed apart from the first frame and connected to an electrode of the light emitting element through a metal wire, and a resin package manufactured covering the first light emitting element, the first frame and the second frame.

In the method for manufacturing the semiconductor light emitting device described in Japanese Laid-Open Patent Application Publication No. 2013-4807, to begin with, first resin covering the light emitting element, the first frame, and the second frame is formed on a surface of a metal plate made from a plurality of first frames and a plurality of second frames alternately disposed, and a sacrifice sheet is attached to a surface of the first resin. Then, a groove is formed in the first resin and the sacrifice sheet on the metal plate along an outer circumference of the resin package, and the groove is filled with the second resin. Then, by cutting the second resin along the groove, a resin package in which the second resin covers the outer periphery of the first resin is formed. Then, by attaching an adhesive sheet that has more adhesive power than the sacrifice sheet on the second resin covering the divided resin package and peeling the adhesive sheet, the second resin formed on the upper surface of the first resin is removed with the sacrifice sheet. Thus, a light emitting surface is exposed, and a semiconductor light emitting device is completed.

However, in the method for manufacturing the semiconductor light emitting device, in forming the first resin and the second resin, each of the first resin and the second resin is formed by being completely hardened and solidified. In such a conventional resin forming method, because resin with elasticity cannot be obtained and because the resin hardly has restorability, the resin is liable to be destroyed by deformation and the like when a stress is added to the resin in installing the semiconductor light emitting device.

SUMMARY OF THE INVENTION

The present disclosure aims at providing a module that excels in flexibility and restorability and has high toughness by significantly changing a manufacturing method from the conventional art.

According to an embodiment, there is provided a method for manufacturing a module including N layers of stacked resin is provided. In the method, resin of a first layer is cured to a degree that does not fully harden the resin of the first layer. Resin of a Mth layer is stacked on resin of a (M−1)th layer, wherein M is a natural number of two or more and less than N. The resin of the Mth layer is cured to a degree that does not fully harden the resin of the Mth layer. Stacking the resin of the Mth layer and curing the resin of the Mth layer are repeated. Then, resin of Nth layer is stacked, and all of the N layers of stacked resin are fully hardened.

Additional objects and advantages of the embodiments are set forth in part in the description which follows, and in part will become obvious from the description, or may be learned by practice of the disclosure. The objects and advantages of the disclosure will be realized and attained by means of the elements and combinations particularly pointed out in the appended claims. It is to be understood that both the foregoing general description and the following detailed description are exemplary and explanatory and are not restrictive of the disclosure as claimed.

BRIEF DESCRIPTION OF THE DRAWINGS

FIG. 4 is a diagram showing a change of a curing percentage of light transmissive resin from first to fourth layers in a method for manufacturing a module according to the present embodiment;

FIGS. 5A to 5G are diagrams illustrating an example of a method for manufacturing a module;

FIGS. 6A to 6G are diagrams for explaining an example of a method for manufacturing a module according to some embodiment;

FIGS. 7A to 7H are diagrams showing a conventional method for manufacturing a phosphor sheet with a barrier layer;

DETAILED DESCRIPTION OF THE PREFERRED EMBODIMENTS

Embodiments of the present disclosure are described below with reference to accompanying drawings.

First Embodiment

FIG. 1 is a diagram illustrating an example of a series of processes of a method for manufacturing a module according to a first embodiment of the present disclosure. In the first embodiment, examples of manufacturing modules using light transmissive resin A and light transmissive resin B are described below. The method for manufacturing the module according to the present embodiment can be applied to a variety of types of resin, and is not limited to an application to light transmissive resin, but examples of using the light transmissive resin A and B are described here. The light transmissive resin is frequently used for an optical semiconductor device using an LED (Light Emitting Diode), and has many applications. Here, in the method for manufacturing the module according to the present embodiment, a module is manufactured utilizing hardening percentage properties of resin to be used for the manufacture.

Figure 2:
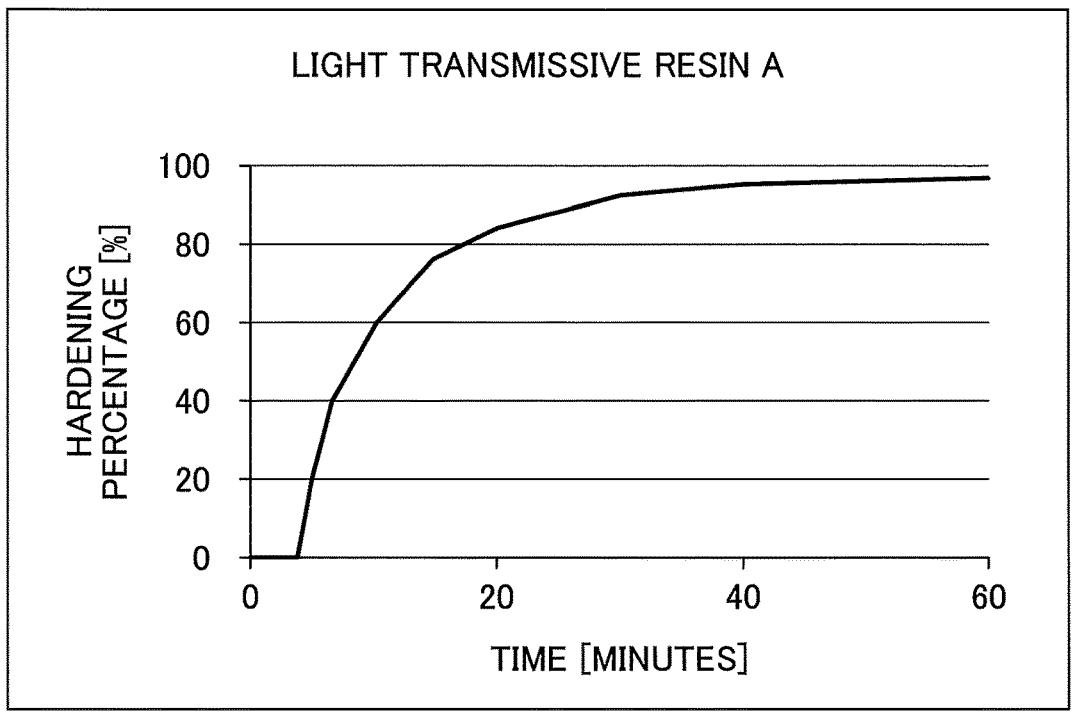
FIG. 2 is a diagram showing curing percentage properties of light transmissive resin A.

FIG. 2 is a diagram showing hardening percentage properties of the light transmissive resin A. In FIG. 2, a horizontal axis indicates time (minutes), and a vertical axis indicates a hardening percentage (%). As increasing a heating period at a constant temperature, the light transmissive resin A hardens more and more. The hardening percentage of the light transmissive resin A reaches about 60% by 10-minute heating, exceeds about 80% by 20-minute heating, and exceeds 90% by 30-minute heating. Then, even if the period of time exceeds 60 minutes, the hardening percentage does not reach 100%, although the percentage reaches close to 100%. Here, a state of completing the hardening is referred to as completely hardening (or hardened) or fully hardening (or hardened). However, in general, even if the hardening is completed, the hardening percentage does not reach 100%, and is likely to stay in a range of about 96 to about 99% in general. In the present embodiment, in a real process, a state in which the hardening does not develop any more even if the heating is continued and the hardening can be regarded as complete is referred to as completely hardening. With respect to the hardening percentage, the hardening percentage exceeds 95%, and is in a range of 96 to 99%, for example.

Here, the cure means that curing resin to a degree that does not completely harden the resin. For example, the cure has a hardening percentage of 50 to 95%.

Figure 3:
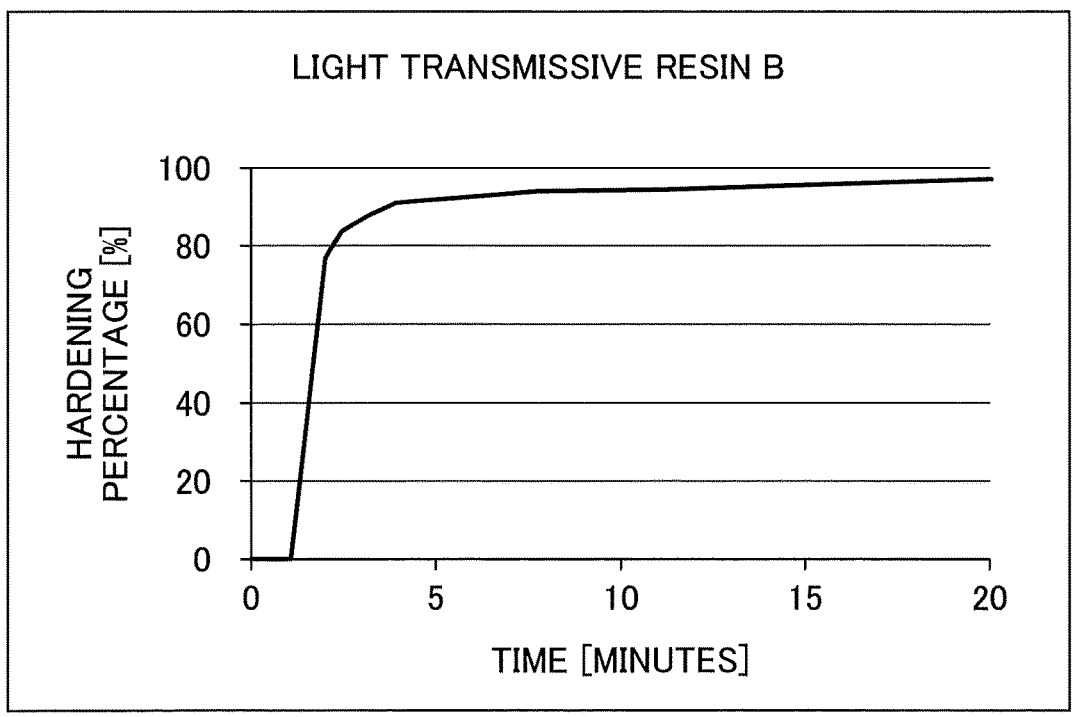
FIG. 3 is a diagram showing curing percentage properties of light transmissive resin B.

FIG. 3 is a diagram showing hardening percentage properties of the light transmissive resin B. In FIG. 3, the horizontal axis indicates time (minutes), and the vertical axis indicates a hardening percentage (%). As shown in FIG. 3, the light transmissive resin B is more likely to harden than the light transmissive resin A, and indicates the hardening percentage properties that exceed the hardening percentage of 80% after the elapse of two minutes, and exceed the hardening percentage of 90% after the elapse of five minutes.

Thus, the hardening percentage varies depending on a type of light transmissive resin. In the present embodiment, a module on which resin is stacked is manufactured while considering these hardening percentage properties.

Figure 1A:
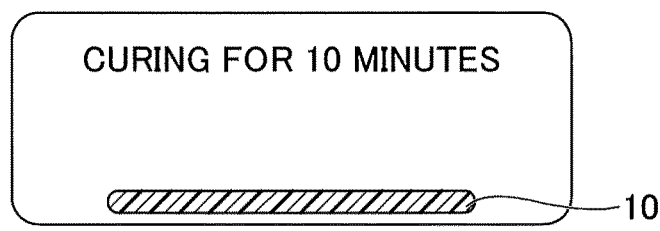
FIGS. 1A to 1E are diagrams illustrating an example of a series of processes of a method for manufacturing a module according to some embodiment of the present disclosure.

FIG. 1A is a diagram illustrating an example of a process of curing a first layer of resin. Light transmissive resin A is used as light transmissive resin 10 of the first layer. Here, the light transmissive resin A is in a state of liquid at first, but is cured by heating. Hence, the hardening of the light transmissive resin is performed in a state of accommodating liquid light transmissive resin A in a container. In general, because the light transmissive resin A has to be formed into a predetermined shape in order to manufacture a module, for example, the curing is performed in a state of filling a mold with the light transmissive resin A, and is formed into the predetermined shape.

In FIGS. 1A to 1E, a mold and the like used in a real process is omitted, and a concept and a principle of the method for manufacturing the module according to the present embodiment is described.

As illustrated in FIG. 1A, to begin with, light transmissive resin 10 of a first layer is formed. Here, the first curing is performed by heating and curing the light transmissive resin A for tem minutes. In the heating for ten minutes, as illustrated in FIG. 2, the hardening percent is about 60%. In other words, in molding the light transmissive resin A of the first layer, the light transmissive resin A is cured until the light transmissive resin A is hardened to about 60%. Here, the liquid light transmissive resin A is solidified at a level that has a hardening percentage of 50% or more. Hence, by curing the liquid light transmissive resin A up to the level that has the hardening percentage of 50% or more, the liquid light transmissive resin A gets solidified (molded).

Figure 1B:
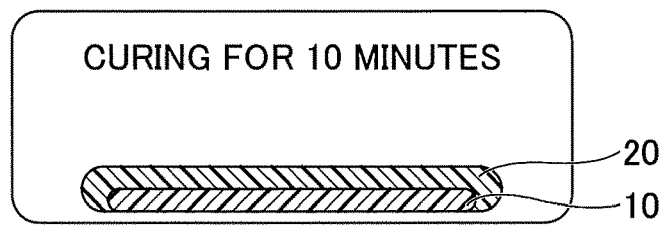

FIG. 1B is a diagram illustrating an example of a process for curing light transmissive resin 20 of a second layer. The light transmissive resin 20 of the second layer uses the light transmissive resin A. The light transmissive resin 20 of the second layer is disposed to be stacked on the solidified light transmissive resin 10 of the first layer. By performing the cure in this state for ten minutes, the light transmissive resin A of the second layer hardens at a hardening percentage of about 60%. In contrast, the light transmissive resin 10 of the first layer further hardens by the cure for further ten minutes, and reaches a hardening percentage of 80%. The light transmissive resin 20 of the second layer that was a liquid at first is solidified, and both of the light transmissive resin 10 of the first layer and the light transmissive resin 20 of the second layer are solidified.

Figure 1C:
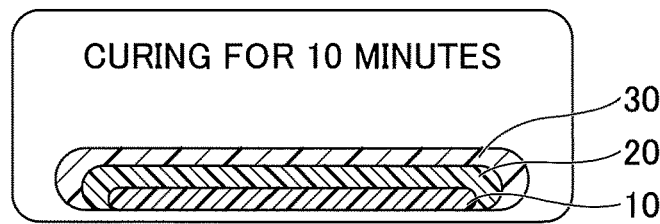

FIG. 1C is a diagram illustrating an example of a process of curing light transmissive resin 30 of a third layer. The light transmissive resin 30 of the third layer is described below by citing an example of using the light transmissive resin A. The light transmissive resin 30 of the third layer in a liquid state is provided to be stacked on the light transmissive resin 20 of the second layer. When performing the cure for ten minutes in this state, the light transmissive resin 30 of the third layer hardens up to about 60%. Because the light transmissive resin 20 of the second layer is cured for about 20 minutes, as shown in FIG. 2, for example, the light transmissive resin 20 of the second layer hardens up to about 80%. Because the light transmissive resin 10 of the first layer is cured for 30 minutes totally, as shown in FIG. 2, for example, the light transmissive resin 10 of the first layer hardens up to about 90% or more.

Figure 1D:
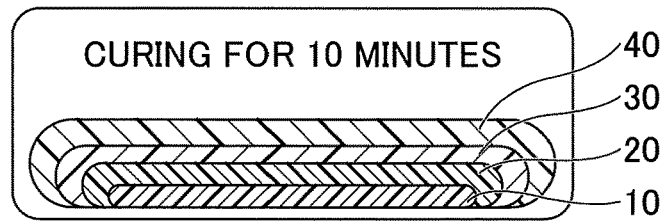

FIG. 1D is a diagram illustrating an example of light transmissive resin 40 of a fourth layer. The light transmissive resin 40 of the fourth layer is described below by citing an example of using the light transmissive resin B. The light transmissive resin 40 of the fourth layer is provided to be stacked on the light transmissive resin 30 of the third layer. Because the light transmissive resin 40 of the fourth layer is made of the light transmissive resin B, the light transmissive resin 40 of the fourth layer is in accordance with the hardening percentage properties in FIG. 3. As shown in FIG. 3, the light transmissive resin B hardens at a hardening percentage of 90% or more by the cure for ten minutes. In the meantime, because the light transmissive resin 30 of the third layer is totally cured for 20 minutes, the light transmissive resin 30 of the third layer hardens at about 80%. Because the light transmissive resin 20 of the second layer is totally cured for 30 minutes, the hardening percentage exceeds 90%. Because the light transmissive resin 10 of the first layer is totally cured for 40 minutes, the hardening percentage also exceeds 90%.

Figure 1E:
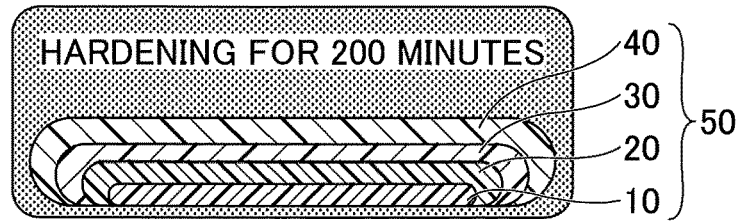

FIG. 1E is a diagram illustrating an example of a complete hardening process. In the complete hardening process, all of the light transmissive resins 10 to 40 of the first to fourth layers are completely hardened. In the present embodiment, by performing the cure for 200 minutes, the light transmissive resins 10 to 40 of the first to fourth layers are completely hardened, and a module 50 is completed. Although a working example is shown later, by following such a complete hardening process, the light transmissive resins 10 to 40 of the first to fourth layers are formed integrally, and borders between the light transmissive resins 10 to 40 of the first to fourth layers can be removed. Thus, the module 50 can have flexibility and extensibility, and the module 50 that is unlikely to be destroyed and has tolerance can be manufactured.

FIG. 4 is a diagram showing change of hardening percentage of the light transmissive resins 10 to 40 of the first to fourth layers in the method for manufacturing the module according to the present embodiment. As shown in FIG. 4, the light transmissive resin 10 to 40 of the first to fourth layers are cured so that the hardening percentage becomes in a rage of 50 to 95%, and then hardened by spending a sufficient period of time so as to reach a hardening percentage close to 100%. By controlling the hardening percentage, the light transmissive resins 10 to 40 of the first to fourth layers are formed integrally, which allows a flexible and strong module 50 to be manufactured. Here, an ideal of hardening is to achieve a hardening percentage of 100%, and because achieving a hardening percentage of 99.99% is not impossible if conditions are preferable, an upper limit of the hardening percentage of the hardening may be higher than 99%.

Moreover, the curing performed by 40 minutes in FIG. 4 is the cure to control the hardening percentage in a range of 50 to 95% without hardening the light transmissive resins 10 to 40 of the first to fourth layers. Such control can be achieved by considering the hardening properties shown in FIG. 2 and FIG. 3.

Here, in the present embodiment, although an example of manufacturing the module 50 by stacking the light transmissive resins 10 to 40 of the first to fourth layers is described, the present embodiment can be generalized and be applied to a module having more resin layers. That is, after solidifying the light transmissive resin 10 of the first layer, for resins from the second layer to Nth (N is natural number of two or more) layer, by performing processes of stacking light transmissive resin of (N−1)th layer, curing each layer sequentially until solidifying but not fully hardening each transmissive resin, and finally hardening all of the first to N layers completely, even if the number of layers increase, a flexible and restorable module 50 whose each layer is integrated therein can be manufactured.

Second Embodiment

Next, a method for manufacturing a module according to a second embodiment is described below.

FIG. 5A to 5G are diagrams illustrating an example of the method for manufacturing the module according to the second embodiment. FIGS. 5A to 5G illustrate an example of manufacturing a phosphor sheet with a barrier layer used in an optical module using an LED. In the method for manufacturing the module according to the second embodiment, a method of manufacturing the phosphor sheet with the barrier layer as a module is described including a specific method of stacking and hardening resin layers.

FIG. 5A is a diagram illustrating an example of a handling substrate setting process. In the handling substrate setting process, a mold 60 is opened, and a handling substrate 70 is set on the upper mold 61. Nothing is set on a lower mold at this stage.

In the method for manufacturing the phosphor sheet according to the present embodiment, the phosphor sheet is manufactured by compression molding using the mold 60. The mold 60 has the upper mold 60 and the lower mold 62. The handling substrate 70 has a film-like form and is to be finally removed.

FIG. 5B is a diagram illustrating an example of a first light transmissive resin supply process. In the first light transmissive resin supply process, first light transmissive resin 80 is supplied into the lower mold 62 of the opened mold 60. Here, for example, liquid light transmissive resin into which particles of a phosphor are mixed and then kneaded is used as the first light transmissive resin 80.

FIG. 5C is a diagram illustrating an example of a phosphor sheet molding process. In the phosphor sheet molding process, after closing the mold 60, a predetermined pressure and a predetermined heat are applied to the first light transmissive resin 80 for a predetermined period of time, and the first light transmissive resin 80 is cured, thereby molding solidified first light transmissive resin 80. Here, solidified first light transmissive resin 81 is not completely hardened, but is hardened in a range of 50 to 95%. Here, the hardening percentage is preferably set at a value as low as possible beyond 50% while considering the next curing, and for example, the first light transmissive resin 80 may be cured to a hardening percentage of about 50 to about 65%. Here, because a solidified first light transmissive resin 81 contains phosphor, the first light transmissive resin 81 serves as a phosphor sheet 81 (which may be hereinafter referred to as a "phosphor sheet 81").

Figure 5F:
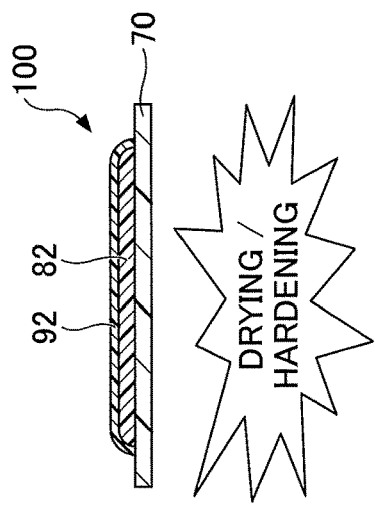
Figure 5E:
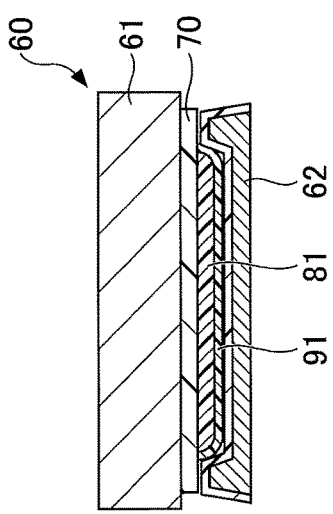
Figure 5D:
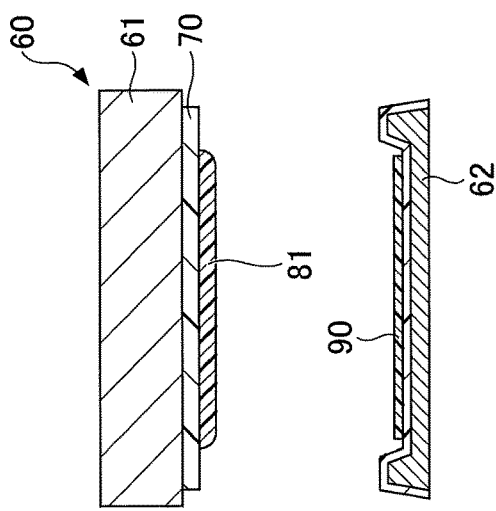

FIG. 5D is a diagram illustrating an example of light transmissive resin for a barrier sheet supply process. In the light transmissive resin for the barrier sheet supply process, the mold 60 is opened, and second light transmissive resin 90 for a barrier sheet is supplied into the lower mold 62.

To form the barrier sheet on a surface of the phosphor sheet 81 integrally, the second light transmissive resin 90 for the barrier layer is supplied to the lower mold while holding the phosphor sheet 81 on the upper mold 61.

The second light transmissive resin 90 may be the same resin as the first light transmissive resin 80, or may be different resin from the first light transmissive resin 80. However, even if the different resins are used, the resin system is preferably the same as each other in order to stabilize optical properties. For example, when silicone resin is used as the first light transmissive resin 80, silicone resin is also preferably used as the second light transmissive resin. Moreover, when acryl resin is used as the first light transmissive resin 80, acryl resin is also preferably used as the second light transmissive resin 90. Here, because both the silicone resin and the acryl resin include various types of compounds, there is no problem with using different compounds or different resin products as long as the belonging system is the same as each other. However, using the first light transmissive resin 80 and the second light transmissive resin 90 that belong to the same resin system is not required, but using the first light transmissive resin 80 and the second light transmissive resin 90 that belong to different resin systems is possible.

Furthermore, a variety of light transmissive resin can be used as the second light transmissive resin 90 depending on the intended use as long as the light transmissive resin is appropriate for a barrier sheet. For example, silicone resin or acryl resin can be used as the second light transmissive resin 90.

Here, the barrier sheet is provided on the surface of the phosphor sheet 81, and is a protective film to prevent moisture and dust from entering the phosphor sheet 81. Resin having a controlled oxygen transmissive percentage is used as the barrier sheet. Hence, the resin having the controlled oxygen transmissive percentage as discussed above is preferably selected as the second light transmissive resin 90.

FIG. 5E is a diagram illustrating an example of a barrier sheet molding process. In the barrier sheet molding process, after the mold 60 is closed, a predetermined pressure and a predetermined heat are applied to the phosphor sheet 81 and the second light transmissive resin for a predetermined period of time, and the second light transmissive resin is cured, which becomes a solidified second light transmissive resin. Thus, the barrier sheet 91 is molded together with the phosphor sheet 81. Here, the solidified second light transmissive resin is not completely hardened, but is hardened to a level of solidifying the second light transmissive resin 90. As discussed above, the hardening percentage is controlled to harden in a range of about 50 to about 95%. Because the solidified first light transmissive resin 81 further hardens, the hardening percentage is preferably set at a low hardening percentage beyond 50%. For example, the hardening percentage of the barrier sheet 91 may be in a range of 50 to 65%.

Here, the phosphor sheet 81 is resin of the first layer, and the barrier sheet 91 corresponds to the resin of the second layer. When using the mold 60, the resin of the first layer (which is the solidified first light transmissive resin 81) is held on the upper mold 61, and the resin (which is the second light transmissive resin 90) of the second layer from the bottom is structured to be stacked on the resin of the first layer.

FIG. 5F is a diagram illustrating an example of a complete hardening process. In the complete hardening process, the handling substrate 70 on which the solidified first light transmissive resin 81 and the solidified second light transmissive resin 91 are formed is taken out of the mold 60, the solidified first light transmissive resin 81 and the solidified second light transmissive resin 91 are hardened until being completely hardened. In other words, the solidified first light transmissive resin 81 and the solidified second light transmissive resin 91 are hardened for a period of time that is longer than the phosphor sheet molding process of FIG. 5C and the barrier sheet molding process of FIG. 5E, and the completely hardened phosphor sheet 82 and barrier sheet 92 are formed. Here, as necessary, in completely hardening, a hardening temperature may be changed to shorten the heating period. Thus, the completely hardened phosphor sheet 82 and the barrier sheet 92 are almost completely mold integrally, and the hardening percentage exceeds 95%, and becomes a value close to 100%. The hardening percentage at this time may be, for example, in a range of 96 to 99.99%.

Because the barrier sheet 92 and the phosphor sheet 82 are integrated, there is no border between the barrier sheet 92 and the phosphor sheet 82, and a phosphor sheet with a barrier layer 100 is formed in a state in which the completely hardened barrier sheet 92 and the phosphor sheet 82 are present continuously. In this regard, the present embodiment differs from a configuration of bonding a single barrier sheet to a phosphor sheet. This is because the bonding causes a bonding layer between the barrier sheet and the phosphor sheet, and includes a border.

Moreover, after the complete hardening, the phosphor sheet with the barrier layer 100 is dried for a predetermined period of time.

Figure 5G:
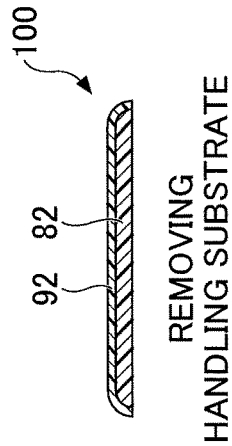

FIG. 5G is a diagram illustrating an example of a handling substrate removing process. In the handling substrate removing process, the handling substrate 70 is removed from the phosphor sheet with the barrier layer 100. Thus, the phosphor sheet with the barrier layer 100 is obtained. Here, a drying period of time of the phosphor sheet with the barrier layer 100 can be set at a variety of periods of time depending on the intended use as long as the phosphor sheet with the barrier sheet 100 can be dried and completely hardened.

The obtained phosphor sheet with the barrier layer 100 has elastic and flexible properties or extendable and stretchable properties, and becomes a very tolerant and irrefrangible sheet.

Third Embodiment

FIGS. 6A to 6G are diagrams for explaining an example of a method for manufacturing a module according to a third embodiment. In the method for manufacturing the module according to the third embodiment, a method for manufacturing a phosphor sheet with a barrier layer is described below similarly to the method for manufacturing the module according to the second embodiment.

FIG. 6A is a diagram illustrating an example of a handling substrate setting process. In the handling substrate setting process, a handling substrate 70 is set on the upper mold 61 of the mold 60. Here, the handling substrate setting process is the same as the process of FIG. 5A in the second embodiment, the description is omitted.

FIG. 6B is a diagram illustrating an example of first light transmissive resin supply process. In the first light transmissive resin supply process, first light transmissive resin 90 is supplied to the lower mold 62 of the mold 60. Here, the second light transmissive resin 90 for the barrier sheet in the second embodiment is used as the first light transmissive resin 90. In other words, the phosphor sheet with the barrier layer may be formed by forming a barrier sheet first. In the third embodiment, an embodiment of forming the phosphor sheet with the barrier sheet from the barrier sheet is described below.

Here, because properties of the light transmissive resin 90 for the barrier sheet are the same as described in the second embodiment, the description is omitted.

FIG. 6C is a diagram illustrating an example of a barrier sheet molding process. In the barrier sheet molding process, after closing the mold 60, a predetermined pressure and a predetermined heat are applied to the first light transmissive resin 90 for a predetermined period of time, and the first light transmissive resin 90 is cured, thereby molding solidified first light transmissive resin 90. Here, solidified first light transmissive resin 91 is not completely hardened, but is hardened in a range of 50 to 95%. Here, the hardening percentage is preferably set at a value as low as possible beyond 50% while considering the next curing, and for example, the first light transmissive resin 90 may be cured to a hardening percentage of about 50 to about 65%. The first light transmissive resin 91 serves as a barrier sheet 91 (which may be hereinafter referred to as a "barrier sheet 91").

FIG. 6D is a diagram illustrating an example of second light transmissive resin supply process. In the second light transmissive resin supply process, the mold 60 is opened, and second light transmissive resin 80 for a phosphor sheet is supplied into the lower mold 62. Here, the second light transmissive resin 80 for the phosphor sheet may be liquid resin into which phosphor particles are mixed and kneaded.

Here, the second light transmissive resin 80 for the barrier sheet is supplied to the lower mold 62 while the barrier sheet 91 is held on the upper mold 61 to integrally form the phosphor sheet on the surface of the barrier sheet 91.

The second light transmissive resin 80 preferably belongs to the same resin system as the first light transmissive resin 90 similarly to the second embodiment even if the stacking sequence differs from the second embodiment. Hence, the description is omitted because the contents are the same as described in the second embodiment.

FIG. 6E is a diagram illustrating an example of a phosphor sheet molding process. In the phosphor sheet molding process, after the mold 60 is closed, a predetermined pressure and a predetermined heat are applied to the barrier sheet 91 and the second light transmissive resin 80 for a predetermined period of time, and the second light transmissive resin 80 is cured, which becomes a solidified second light transmissive resin 81. Thus, the barrier sheet 91 is molded together with the phosphor sheet 81. Here, the solidified second light transmissive resin 80 is not completely hardened, but is hardened to a level of solidifying. As discussed above, the hardening percentage is controlled to harden in a range of about 50 to about 95%. Because the solidified first light transmissive resin 81 further hardens, the hardening percentage is preferably set at a low hardening percentage beyond 50%. For example, the hardening percentage of the phosphor sheet may be in a range of 50 to 65%.

Here, the barrier sheet 91 is resin of the first layer, and the phosphor sheet 81 corresponds to the resin of the second layer. When using the mold 60, the resin of the first layer (which is the solidified first light transmissive resin 91) is held on the upper mold 61, and the resin (which is the second light transmissive resin 80) of the second layer from the bottom is structured to be stacked on the resin of the first layer.

FIG. 6F is a diagram illustrating an example of a complete hardening process. In the complete hardening process, the handling substrate 70 is taken out of the mold 60, the solidified first light transmissive resin 91 and the solidified second light transmissive resin 81 are hardened until being completely hardened. Thus, a phosphor sheet with a barrier layer 101 if formed. Here, the description is the same as that of the second embodiment only except for a vertical positional relationship, the description is omitted.

FIG. 6G is a diagram illustrating an example of a handling substrate removing process. In the handling substrate removing process, the handling substrate 70 is removed from the phosphor sheet with the barrier layer 101. Thus, the phosphor sheet with the barrier layer 101 is obtained.

The obtained phosphor sheet with the barrier layer 101 has elastic and flexible properties or extendable and stretchable properties, and becomes a very tolerant and irrefrangible sheet.

Thus, the module according to the present embodiments can be manufactured even if the stacking and forming order between the resin of the first layer and the resin of the second layer is changed, and various configurations of modules can be manufactured depending on the intended use.

Comparative Example

Next, a conventional method for manufacturing a module is described below as a comparative example.

FIGS. 7A to 7H are diagrams illustrating a conventional method for manufacturing a phosphor sheet with a barrier layer. Here, the comparative example corresponds to a structure of the phosphor sheet with the barrier layer according to the second embodiment.

FIG. 7A is a diagram illustrating an example of a handling substrate setting process, and FIG. 7B is a diagram illustrating an example of first light transmissive resin supply process. Because these processes are the same as FIG. 5A and FIG. 5B of the second embodiment, the description is omitted.

FIG. 7D is a diagram illustrating an example of phosphor sheet molding process. In the phosphor sheet molding process, after closing the mold 60, a predetermined pressure and a predetermined heat are applied to the first light transmissive resin 80 for a predetermined period of time, and the first light transmissive resin 80 is cured, thereby molding hardened first light transmissive resin 80. On this occasion, the first light transmissive resin 80 does not have to be kept at a hardening percentage of 50 to 95%, and may be heated as much as possible by the mold 60 because there is no problem with completely hardening the first light transmissive resin 80.

FIG. 7D is a diagram illustrating an example of a complete molding process. In the complete molding process, the handling substrate 70 on which solidified first light transmissive resin 81 is formed is removed from the mold 60, and the solidified first light transmissive resin 81 is hardened until completely hardening, and completely hardened first light transmissive resin 82 is formed. That is, different from the second embodiment, after the first light transmissive resin 81 is solidified, the first light transmissive resin 80 is completely hardened before another resin is stacked thereon by heating, and the fully hardened phosphor sheet 82 are completed.

FIG. 7E is a diagram illustrating an example of light transmissive resin for a barrier sheet supply process. In the light transmissive resin for the barrier sheet supply process, the mold 60 is opened, and second light transmissive resin 90 for a barrier sheet is supplied into the lower mold 62. This process is the same as that of the second embodiment.

FIG. 7F is a diagram illustrating an example of a barrier sheet molding process. In the barrier sheet molding process, after the mold 60 is closed, a predetermined pressure and a predetermined heat are applied to the phosphor sheet 82 and the second light transmissive resin 90 for a predetermined period of time, and the second light transmissive resin 90 is completely hardened, thereby forming the completely hardened second light transmissive resin 90. Because the phosphor sheet 82 is completely hardened in advance, and because the barrier sheet 92 is also completely hardened, the phosphor sheet 82 and the barrier sheet 92 are not integrated, and the separate phosphor sheet 82 and the separate barrier sheet 92 are bonded to each other.

FIG. 7G is a diagram illustrating an example of a phosphor sheet with a barrier layer removing process. In the phosphor sheet with the barrier layer removing process, the phosphor sheet with the barrier layer 102 composed of the completely hardened barrier sheet 92 and the phosphor sheet 82 are removed from the upper mold 61 together. A boarder is found between the barrier sheet 92 and the phosphor sheet 82, and the barrier sheet 92 and the phosphor sheet 82 are not integrated, thereby forming the phosphor sheet with the barrier layer 102 having scarce flexibility. Hence, the phosphor sheet with the barrier layer 102 lacks tolerance, and has properties that are likely to be damaged.

FIG. 7H is a diagram illustrating an example of a handling substrate removing process. Because this process is the same as the processes illustrated in FIG. 5G and FIG. 6G of the second and third embodiments, the description is omitted.

Figure 8:
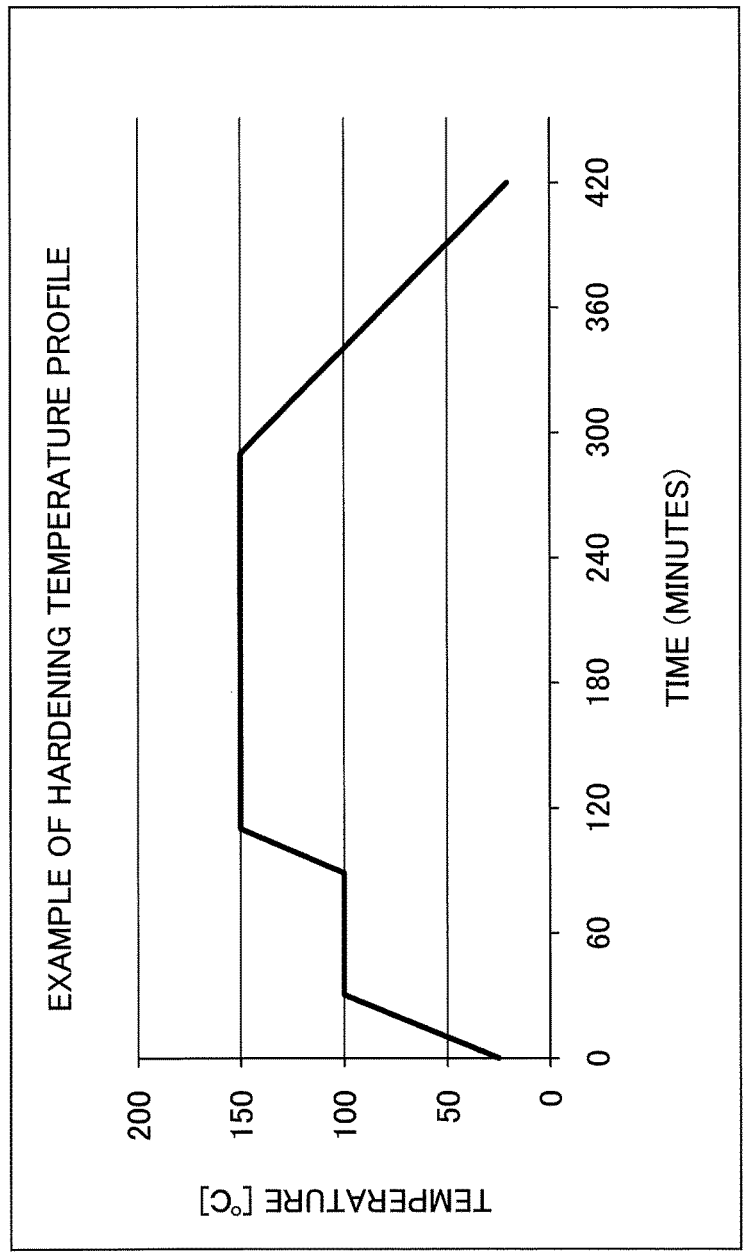
FIG. 8 is a diagram showing a temperature profile of a method for manufacturing a module according to some embodiment.

FIG. 8 is a diagram showing a temperature profile of a conventional method for manufacturing a module. As shown in FIG. 8, the temperature becomes constant at 100° C., and solidifies the first light transmissive resin 80. After solidifying and removing the first light transmissive resin 80, the temperature is raised to 150° C., thereby fully hardening the phosphor sheet 82. Hence, the phosphor sheet 82 promptly hardens alone, and the barrier sheet 91 also hardens according to a similar temperature profile. Thus, the phosphor sheet 82 and the barrier sheet 92 having scarce flexibility are stacked, and the phosphor sheet with the barrier layer 108 having scarce flexibility is formed.

Thus, in the conventional method for manufacturing the module, because the resin is fully hardened separately, the resin has no chance to be integrated. As a result, a flexible resin module cannot be manufactured, and cannot have strong tolerance. The method for manufacturing the module according to the present embodiment improves such a conventional method for manufacturing a module, and a module with a barrier layer and the like having flexibility and extendibility can be manufactured.

Fourth Embodiment

Next, an embodiment of applying the method for manufacturing the module to a process of manufacturing an optical module is described below.

Figure 9:
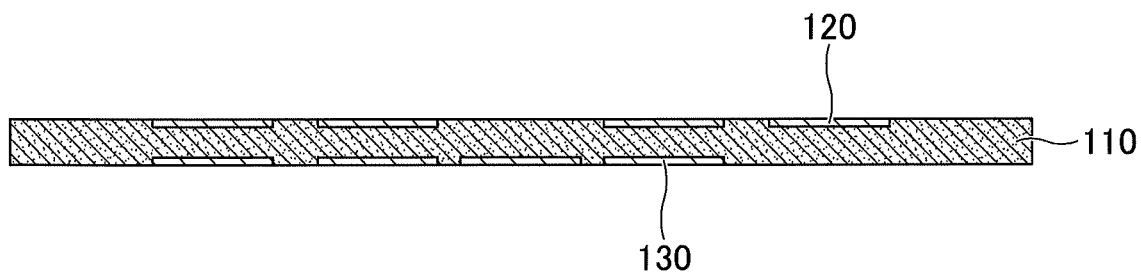
FIG. 9 is a diagram illustrating an example of a substrate preparation process of a method for manufacturing an optical module according to some embodiment of the present disclosure.

FIG. 9 is a diagram illustrating an example of a substrate preparing process of a method for manufacturing an optical module according to an embodiment of the present disclosure. In the substrate preparing process, a printed circuit board 110 is prepared. The printed circuit board 110 is an example of a substrate on which an LED (Light Emitting Diode) chip is mounted, and another substrate may be used as long as the LED chip can be mounted thereon. In the present embodiment, an example of using the printed circuit board 110 as a substrate is described. Here, the printed circuit board 110 is configured to have a rectangular shape in a plan view.

The printed circuit board 110 includes an electrode 120 on which an LED chip is to be mounted in a top surface, and an external connection terminal 130 to be connected to a motherboard in a back surface. A plurality of electrodes 120 and a plurality of external connection terminals 130 are provided on the top surface and the back surface of the printed circuit board 110. Because the LED chip to be mounted usually has two terminals of an anode and a cathode, the plurality of electrodes 120 and the plurality of external connection terminals 130 are provided. Moreover, because a plurality of LED chips are usually mounted on the top surface of the printed circuit board 110, numbers of the electrodes 120 and the external connection terminals 130 are determined depending on the number of LED chips to be mounted.

Here, the electrodes 120 on the top surface side and the external connection terminals 130 on the back surface side are connected in the printed circuit board 110 via an interconnection pattern, and details in this point is described later.

Moreover, in the substrate preparing process, a printed circuit board 110 is cleaned to remove foreign substances attached to the printed circuit board 110 in addition to preparing the printed circuit board 110. Furthermore, after the cleaning, the printed circuit board 110 is dried by baking.

Figure 10:
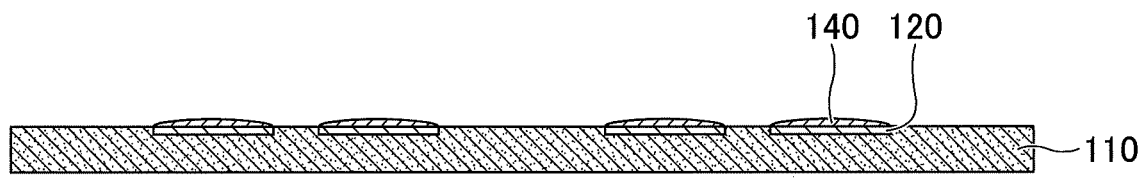
FIG. 10 is a diagram illustrating an example of a bonding paste application process of a method for manufacturing an optical module according to some embodiment of the present disclosure.

FIG. 10 is a diagram illustrating an example of a bonding paste application process of the method for manufacturing the optical module according to the fourth embodiment of the present disclosure. Here, because the external connection terminals 130 do not directly relate to the method for manufacturing the optical module, a depiction of FIG. 10 and the subsequent drawings is omitted.

In the bonding paste application process, a bonding paste 140 is applied over the electrodes 120 provided on the top surface of the printed circuit board 110. The bonding paste 140 joins the electrodes of the LED chips to the electrodes 120 in the top surface of the printed circuit board 1110 by being heated and melted, and a variety of bonding pastes 140 can be used as long as the bonding paste can electrically connect the electrodes of the LED chips to the electrodes 120. For example, an Au—Sn (Gold-Tin) paste may be used as the bonding paste 140. Here, after the bonding paste 140 is applied to the surface of the electrodes 120, the bonding paste 140 is melted by heating, and then cooled. After cooled, remaining flax is removed by cleaning. By the bonding paste application process, the electrodes 120 are prepared to allow the LED chips to be mounted thereon.

Figure 11:
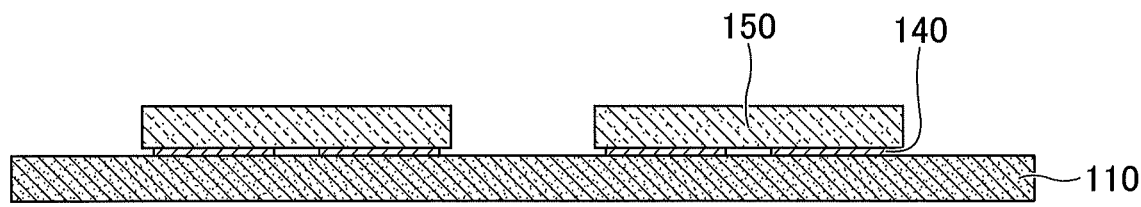
FIG. 11 is a diagram illustrating an example of a mounting process of a method for manufacturing an optical module according to some embodiment of the present disclosure.

FIG. 11 is a diagram illustrating an example of a mounting process of the method for manufacturing the optical module according to the fourth embodiment of the present disclosure. In the mounting process, LED chips 150 separated from a wafer are mounted on the printed circuit board 110. Here, the LED chips 150 are an example of a light emitting element, and another element may be mounted as long as the element can emit light. In the present embodiment, an example of using the LED chip 150 as the light emitting element is described below.

The LED chips 150 are mounted on the printed circuit board 110 in a face down manner. More specifically, terminals (or electrodes) of the LED chips 150 are arranged to be in the lower surface and are directly bonded to the electrodes 120 via the bonding pastes 140 without using binding wires. Due to such flip chip mounting, the bonding wires are not needed, and low height mounting becomes possible.

Here, mounting the LED chips 150 on the electrodes 120 is usually performed by thermal compression bonding, but is not limited to the method, and a variety of mounting methods can be used as long as the flip chip bonding is possible. Here, the thermal compression bonding is a method of pressing the LED chips 150 to the substrate 110 (accurately, the electrodes 120) while heating with a crimp head.

Moreover, the LED chips 150 are arranged in the surface opposite to the printed circuit board 110, and the upper surface becomes a light emitting and drawing surface. In other words, the surface opposite to the terminals (or electrodes) of the LED chips 150 becomes the light emitting and drawing surface, and light is emitted upward in an example of FIG. 11.

Figure 12:
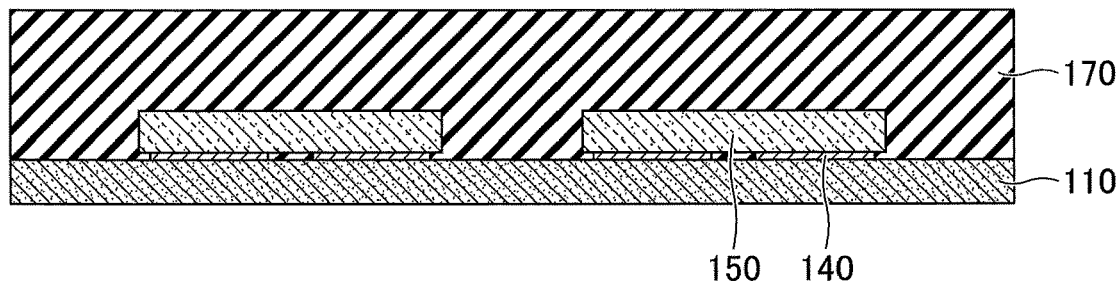
FIG. 12 is a diagram illustrating an example of a sealing process of a method for manufacturing an optical module according to some embodiment of the present disclosure.

FIG. 12 is a diagram illustrating an example of a sealing process of the method for manufacturing the optical module according to the fourth embodiment of the present disclosure. In the sealing process, silicone resin 170 containing a light wavelength conversion substance is supplied onto the mounting surface of the printed circuit board 110 on which the LED chips 150 are mounted, and the mounting surface is sealed.

Here, for example, the light wavelength conversion substance may contain a substance needed to convert light of the LED chip 150 that emits a blue color to a white color. For example, a white color can be obtained by using Yttrium, aluminum and garnet as the light wavelength conversion substance. Moreover, a white color can be obtained by forming a single light emitting source using chips of light emitting diodes of red, green and blue, which are three primary colors, without using the light wavelength conversion substance. Furthermore, a variety of colors of light can be obtained by combining a color of emitted light of an LED chip and a light wavelength conversion substance, with respect to colors other than the white color.

For example, phosphor particles may be used as the light wavelength conversion substance. For example, phosphor particles may be mixed into the silicone resin 170 and then kneaded, and the light wavelength conversion substance containing the phosphor may form the silicone resin 170. Here, to prevent the agglomeration and isolation of the phosphors, transparent particles may be mixed into the silicone resin 170 with the phosphors and then kneaded.

The silicone resin 170 is thermosetting resin, and can form a transparent medium when hardened. Here, the silicone resin 170 is an example, and as long as a transparent medium can form when hardened, another resin may be used.

A sealing process may be implemented by a variety of sealing methods as long as the sealing process can seal a mounting surface of the printed circuit board 110 containing the LED chip 150. An example of the sealing process is described below.

For example, as described in the second embodiment, the silicone resin 170 into which phosphors are mixed and then kneaded is supplied to the lower mold 62 of the mold 60. Moreover, the printed circuit board 110 is set in the upper mold 61 while the sealing surface, which the LED chips 150 mounting surface, is faced downward.

The mold 60 is closed in this state, and is heated while being pressurized, and the silicone resin 170 is cured. The cure at this time is performed to a degree of solidifying the silicone resin 170 but not completely hardening the silicone resin 170. Preferably, the silicone resin 170 is cured at a hardening percentage of 50 to 65%.

Figure 13:
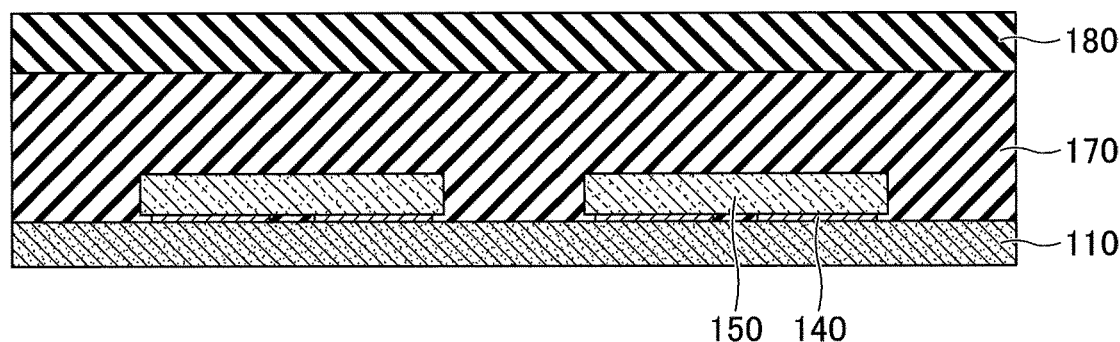
FIG. 13 is a diagram illustrating an example of a transparent resin coating process of a method for manufacturing an optical module according to some embodiment of the present disclosure.

FIG. 13 is a diagram illustrating an example of a transparent resin coating process of the method for manufacturing the optical module according to the fourth embodiment of the present disclosure. In the transparent resin coating process, the top surface of the silicone resin 170 into which the phosphor is mixed and then kneaded is covered with silicon resin 180. As illustrated in FIG. 13, when the printed circuit board 110 is arranged at a lower position and the silicone resin 170 containing the light wavelength conversion substance is arrange at an upper position, the top surface of the silicone resin 170 containing the light wavelength conversion substance becomes an exposed surface. Then, the top surface of the silicone resin 170 containing the light wavelength conversion substance is covered with the silicone resin 180 that does not contain the light wavelength conversion substance. As described above, the silicone resin 180 forms a transparent medium that transmits light when hardened, and as long as the resin has such properties, resin other than the silicone resin 180 may be used. In addition, the same resin (same product) as the silicone resin 170 containing the printed circuit board 110 and the light wavelength conversion substance the silicon resin 180 may be used as the silicon resin 180, or different resin (different product) may be used.

Here, the silicone resin 180 plays a role of protecting the silicone resin 170 containing the light wavelength conversion substance. In other words, the silicone resin 180 covers the silicone resin 170 containing the exposed light wavelength conversion substance, and protects the exposed surface of the silicon resin 170 containing the light wavelength conversion substance without blocking the light wavelength conversion substance.

The method for forming the silicone resin 180 is not specifically limited. For example, as described in the second embodiment, the mold 60 may be opened, and the silicone resin 180 may be supplied into the lower mold 62. After closing the mold 60, the silicone resin 170 and the silicone resin 180 may be cured to a degree of fully hardening the silicone resin 170 and the silicone resin 180 and to a level that solidifies the silicone resin 180. Thus, the silicone resin 170 and the silicone resin 180 are molded integrally.

Here, the same structure or the same product does not have to be necessarily used for the silicone resin 170 and the silicon resin 180, but because the silicone resin 170 and the silicon resin 180 belong to the same resin system, the hardening percentage curves are considered to have the same or similar properties. Hence, by curing the silicone resin 170 and the silicon resin 180 in the same way, the hardening state of the silicone resin 170 and 180 can be accurately understood.

As illustrated in FIG. 13, light emitted from the LED chips 150 is discharged upward while passing the silicone resin 170 that contains the light wavelength conversion substance and the silicone resin 180 that does not contain the light wavelength conversion substance.

Figure 14:
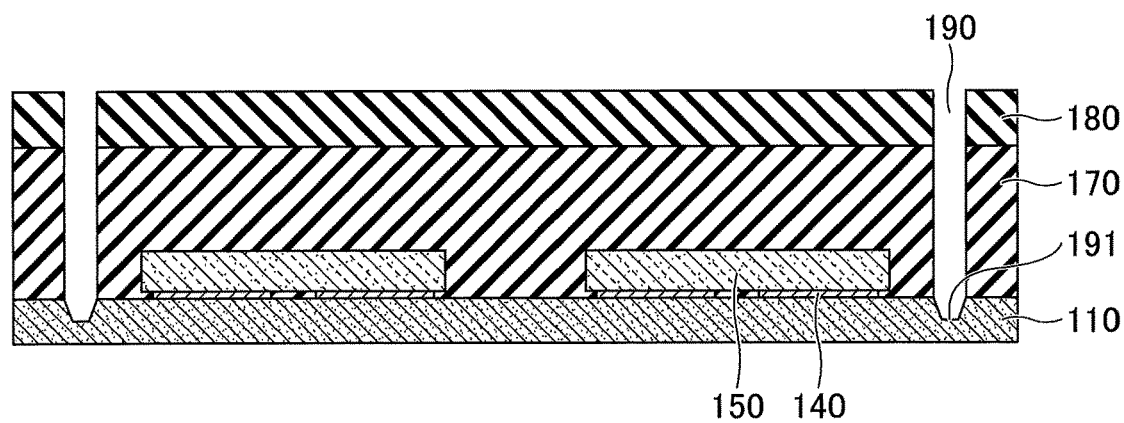
FIG. 14 is a diagram illustrating an example of a groove forming process of a method for manufacturing an optical module according to some embodiment of the present disclosure.

FIG. 14 is a diagram illustrating an example of a groove forming process of the method for manufacturing the optical module according to the fourth embodiment of the present disclosure. In the groove forming process, a groove 190 that penetrates the silicone resin 170 from the top surface of the silicone resin 180 to the printed circuit board 110. The groove 190 does not penetrate through the printed circuit board 110, but is formed at a depth of forming the groove 190 in the printed circuit board 110, and a bottom surface 191 of the groove 190 is formed in the printed circuit board 110. Here, because forming the groove 190 partway through the printed circuit board 110 (substrate) is referred to as a half cut, the present process may be referred to as a half cut process.

As long as the groove 190 is formed, the method for forming the groove is not limited to a specific method, but the groove forming process is generally performed after removing the printed circuit board 110 from the mold 60.

The groove 190 is formed so as to surround the LED chips 150. When the plurality of LED chips 150 is mounted, the groove 190 is formed so as to surround the LED chips 150 except for a region between the LED chips 150. The groove 190 is formed in the vicinity of the periphery of a separated optical module 200 that is described below. In FIG. 14, only a cross section in one direction is illustrated, but the groove 190 is formed in both ends in a direction perpendicular to the crossing direction of FIG. 14. In other words, the groove 190 is formed so as to surround the LED chips 150 by a rectangle, and the groove 190 is formed so as to form a rectangular frame. Here, when the LED chips 150 are preferred to be surrounded by a circle, a circular groove 190 may be formed around the LED chips 150. In the following example, an example in which the printed circuit board 110 has a rectangular shape in a plan view and the groove 190 is formed so as to surround the LED chips 150 by a rectangular frame, is described below.

Figure 15:
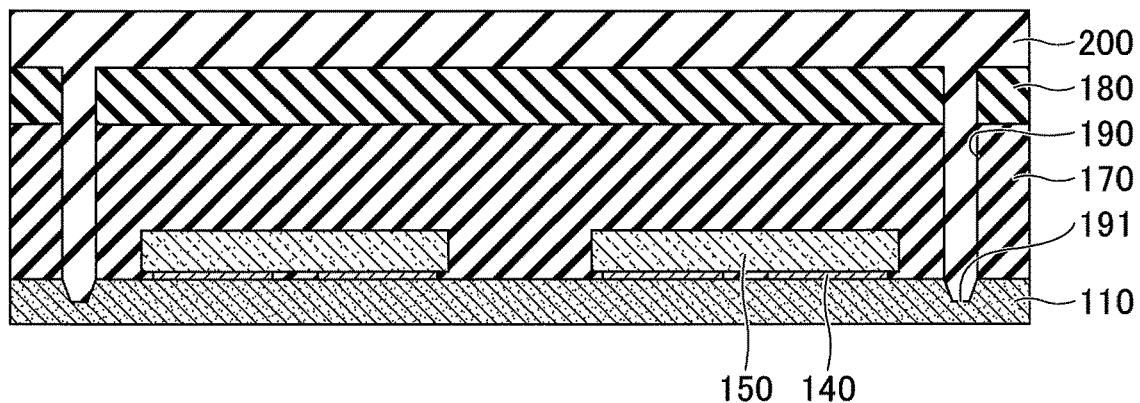
FIG. 15 is a diagram illustrating an example of a light reflection resin sealing process of a method for manufacturing an optical module according to some embodiment of the present disclosure.

FIG. 15 is a diagram illustrating an example of a light reflective resin sealing process of the method for manufacturing the optical module according to the fourth embodiment of the present disclosure. In the light reflective resin sealing process, the groove 190 is filled with resin containing a light reflective substance. The resin containing the light reflective substance may be selected from a variety of resins. In the present embodiment, an example of using white resin 200 as the light reflective resin is describe below. Because the white resin 200 contains the light reflective substance, the white resin 200 can be preferably used as the light reflective resin. The white resin 200 filling the groove 190 forms a reflector of the optical module.

The method for forming the white resin 200 is not limited to a specific method. For example, as illustrated in the second embodiment, a compression molding method may be used in which the printed circuit board 110 is set in the upper mold 61 so that the silicone resin 180 faces downward; the white resin is supplied to the lower mold 62; and then a pressure is applied to the mold 60 while heating the mold 60 after closing the mold 60.

Here, the white resin 200 is cured in a range that does not completely harden the white resin 200. More specifically, although the white resin 200 is solidified and molded, the white resin 200 is cured in a range that does not reach the complete hardening. The hardening percentage may be in a range of 50 to 95%, but for example, may be cured at a hardening percentage in a range of 50 to 65%.

Moreover, because the white resin 200 is considered to differ from the silicone resin 170 and 180 in hardening percentage properties, the hardening is performed while considering the hardening percentage properties of the white resin 200.

Here, because the groove 190 is half-cut until reaching the printed circuit board 110, adhesiveness between the white resin 200 and the groove 190 can be enhanced. More specifically, because the white resin 200 reaches the partway in the thickness direction of the printed circuit board 110, which resembles a state of driving a stake, and because a contact area of the white resin 200 can be further increased, high adhesiveness can be implemented.

Here, when filling the groove 190 with the white resin 200, the top surface of the silicone resin 180 can be covered with the white resin 200. Because filling only the groove 190 with the white resin 200 is usually impossible, the top surface of the silicone resin 180 may be also sealed with the white resin 200.

Thus, when the white resin 200 is formed using the mold 60 once, the printed circuit board 110 is taken out of the mold 60, and the hardening is performed. In the hardening, by applying a predetermined heat for a predetermined period of time, all of the silicone resin 170 and 180 and the white resin 200 are completely hardened. Specifically, the heat is applied so that the hardening percentage of the silicone resin 170 and 180 and the white resin 200 exceed 95% and reach 96 to 99%. Here, 99% does not mean the upper limit. Even if the silicone resin 170 and 180 and the white resin 200 are hardened while aiming at the hardening percentage of 100%, because the hardening percentage is likely to become 99% or lower actually, 99% means an illustration of the hardening percentage. Ideally, the hardening percentage may be 100%, and may be 99.99% if conditions are preferable.

By performing such complete hardening, the silicone resin 170 and 180 and the white resin 200 are formed integrally, and becomes a very flexible and extendible optical module as a total. Here, although boarder lines are clearly shown to illustrate the structure, the border lines between the silicone resin 170, the silicone resin 180 and the white resin 200 becomes thin.

Figure 16:
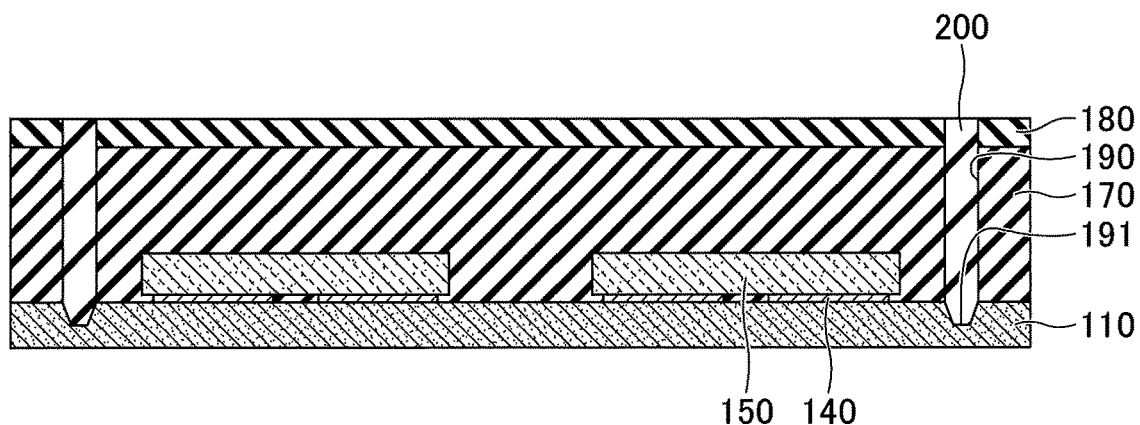
FIG. 16 is a diagram illustrating an example of a surface grinding process of a method for manufacturing an optical module according to some embodiment of the present disclosure.

FIG. 16 is a diagram illustrating an example of a surface grinding process according to the method for manufacturing the optical module according to the fourth embodiment of the present disclosure. In the surface grinding process, a top surface is ground until the silicone resin 180 is exposed. Thus, the unnecessary resin 200 is removed, and a light emitting surface of the optical module made of a transparent medium (silicone resin 180) is formed. Here, the surface grinding may be performed by various methods, and for example, the white resin 200 of the top surface may be ground by a grinding method.

Figure 17:
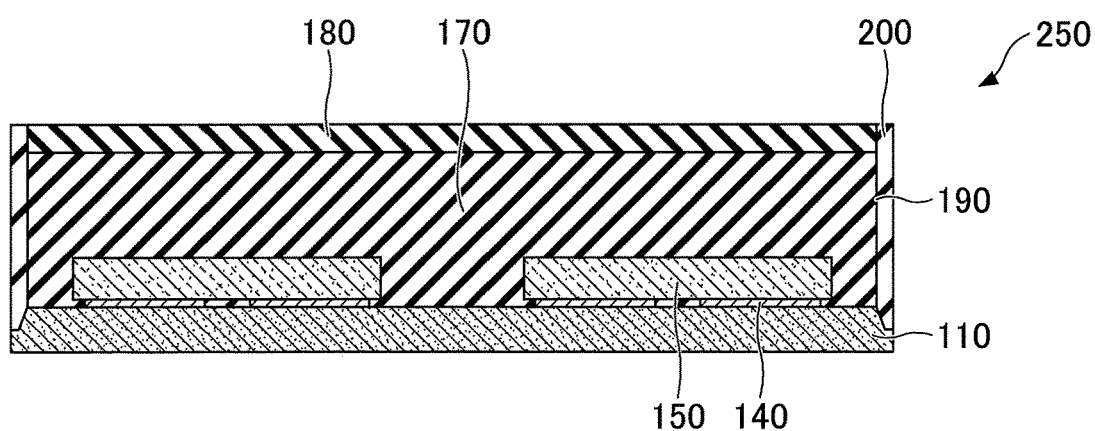
FIG. 17 is a diagram illustrating an example of an optical module separating process of a method for manufacturing an optical module according to some embodiment of the present disclosure.

FIG. 17 is a diagram illustrating an example of a module separating process of the method for manufacturing the optical module according to the fourth embodiment of the present disclosure. In the module separating process, the optical module is divided into separate pieces so as to leave part of the white resin 200 by dicing along the groove 190. By leaving the part of the white resin 200, an outer circumferential surface of the divided optical module is covered with the white resin 200, and goes into a state of having a reflector formed on the outer circumferential surface. Thus, light emitting toward a lateral surface direction is reflected inward among the light emitted from the LED chips 150, and light can be efficiently emitted upward. Here, after finishing the module separating process, a divided optical module 250 is completed. Because the divided optical module 250 has flexibility by being integrated with the resin 170 and 180 sealing the top surface of the printed circuit board 110 containing the LED chips 150, the optical module 250 improves its flexibility as a whole, and has high tolerance to stress and the like.

Thus, according to the method for manufacturing the optical module, because the resin 170, 180 and 200 sealing the mounting surface on which the LED chips 150 of the printed circuit board 110 are mounted are integrated, and has high flexibility and extendibility, the strong optical module 250 having high tolerance can be formed.

Here, the complete hardening process may be performed at a stage of FIG. 16, not in the stage of FIG. 15. After all of the resin 170, 180 and 200 are molded, and before the dicing in FIG. 17 is performed, the complete hardening can be performed at any timing.

Fifth Embodiment

Figure 18A:
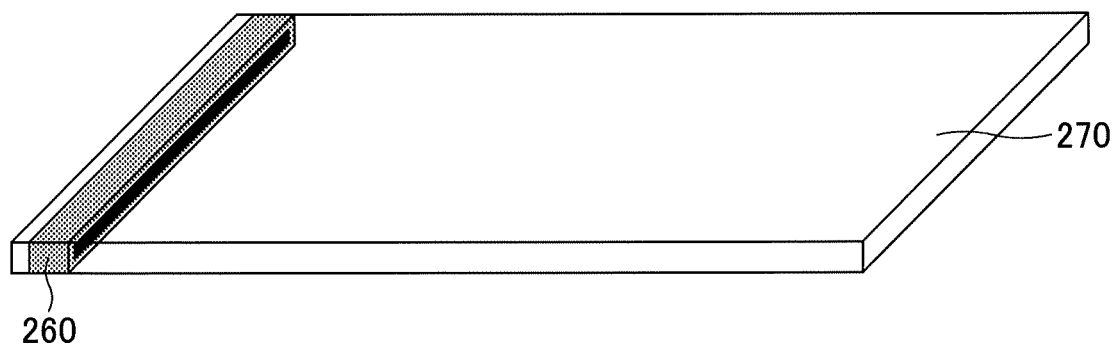
FIGS. 18A and 18B are diagrams illustrating an example of applying a module separating process of a method for manufacturing an optical module according to some embodiment of the present disclosure.
Figure 18B:
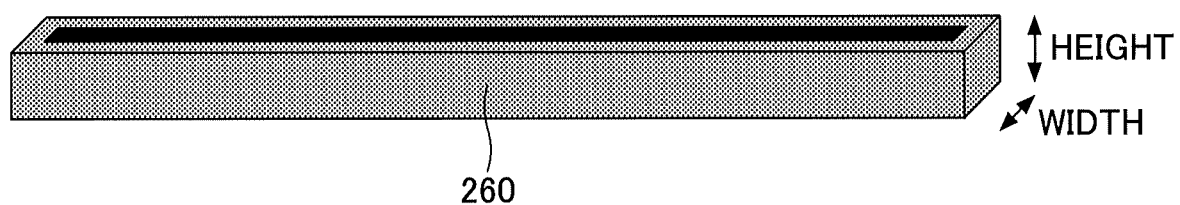

FIGS. 18A and 18B are diagrams illustrating an example of diagram illustrating an example of applying the optical module according to the fourth embodiment to an optical array 260 and a backlight unit 270. FIG. 18A is a diagram illustrating an example of forming an optical array 260 by arraying divided optical modules and illustrating an example of a total configuration of a backlight unit 270 into which the optical array 260 is integrated. FIG. 18B is a diagram illustrating the optical array 260 by taking the optical array 260 out of the backlight unit 270.

As illustrated in FIG. 18A, the optical array 160 is provided to extend along a short side of the outer shape of the backlight unit 270 at one end in a lengthwise direction of the backlight unit 270. The light emitting surface becomes a lateral direction along the surface of the backlight unit 270. A variety of forms of the optical array 260 is described below.

Figure 19:
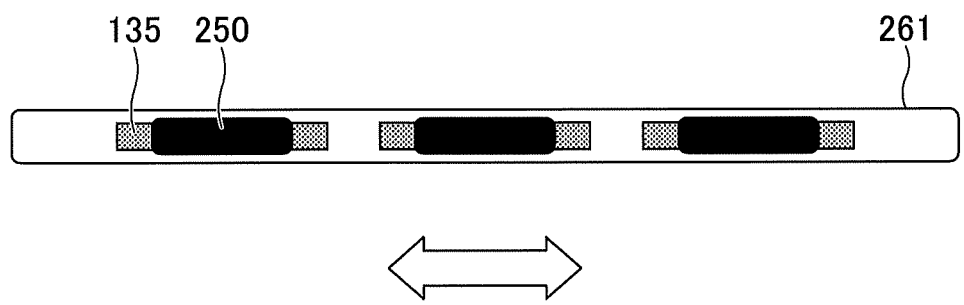
FIG. 19 is a diagram illustrating an example of an optical array according to some embodiment.

FIG. 19 is a diagram illustrating an optical array 260 according to the first embodiment. The optical array 261 according to the first embodiment illustrates a form of a general array. Thus, in general, divided optical modules 250 are arranged along the lengthwise direction of the optical array 261. Here, although FIGS. 11 to 17 illustrate the optical module 250 on which two LED chips 150 are mounted, the LED chip 150 mounted on the optical module 250 may be a single or more. In general, not only two, but more divided LED chips 150 are mounted on the optical module 250.

Here, the optical array 261 includes an electrode 135 to be connected to an electrode 130 (see FIG. 9) on a back surface of the optical module 250. The optical array 261 includes an interconnection therein, which is configured to integrate and electrically connect the plurality of optical modules 250. In the following example, the electrode 135 is illustrated with numerals, but the description is omitted.

Figure 20:
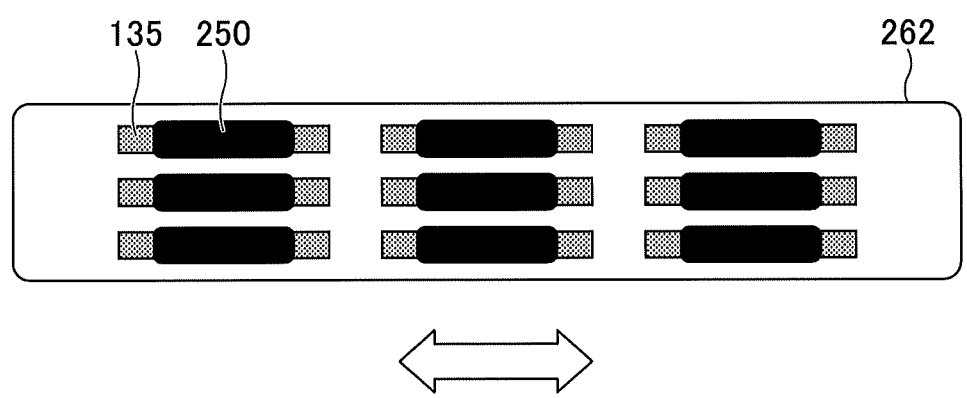
FIG. 20 is a diagram illustrating an example of an optical array according to some embodiment.

FIG. 20 is a diagram illustrating an optical array 262 according to a second embodiment. The optical array 262 according to the second embodiment is configured to include a plurality of rows of optical modules 250 arranged in a width direction of the optical array 261. Specifically, three optical modules 250 are arranged in the width direction of the optical array 262. Thus, by improving the tolerance of the optical module 250, because the optical module 250 is unlikely to be damaged even if a stress is added to the optical array 262, the optical module 250 can be arranged in any form.

Figure 21:
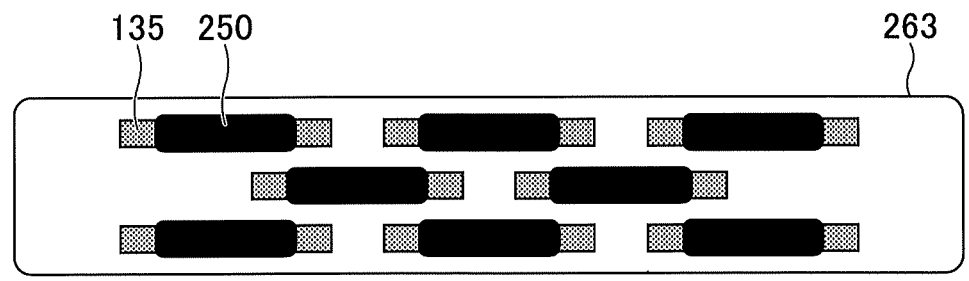
FIG. 21 is a diagram illustrating an example of an optical array according to some embodiment.

FIG. 21 is a diagram illustrating an optical array 263 according to a third embodiment. The optical array 263 according to the third embodiment is configured to arrange three rows of the optical arrays 263 in the width direction and the central row being shifted in the lengthwise direction relative to two end rows. For example, the optical array 263 has such an alternative arrangement.

Figure 22:
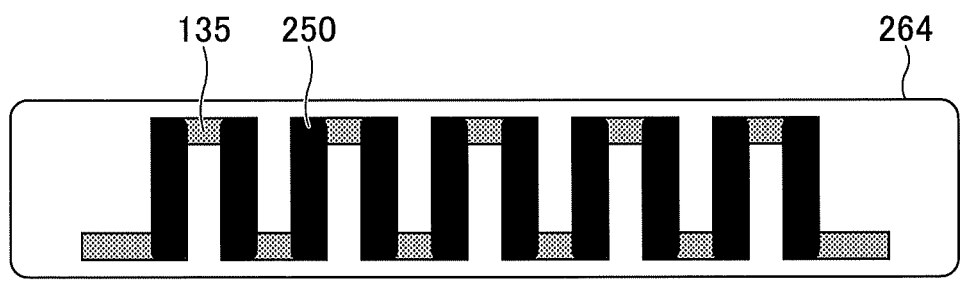
FIG. 22 is a diagram illustrating an example of an optical array according to some embodiment.

FIG. 22 is a diagram illustrating an optical array 264 according to a fourth embodiment. The optical array 264 according to the fourth embodiment is configured to arrange the optical module 250 so as to extend in the width direction of the optical array 264. In other words, the optical modules 250 and the optical array 264 are arranged so as to be perpendicular to each other in their lengthwise directions.

Figure 23:
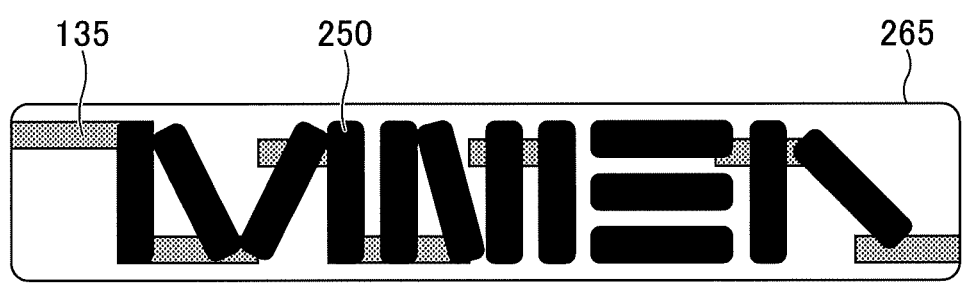
FIG. 23 is a diagram illustrating an example of an optical array according to some embodiment.

FIG. 23 is a diagram illustrating an optical array 265 according to a fifth embodiment. The optical array 265 according to the fifth embodiment is configured to arrange the optical modules 250 by combining a variety of arrangements extending vertically, laterally and obliquely. Thus, even if the optical modules 250 are arranged variously, because the optical modules 250 are flexible and can respond to stresses from a variety of directions, the optical array 265 can be formed without any problem.

Figure 24:
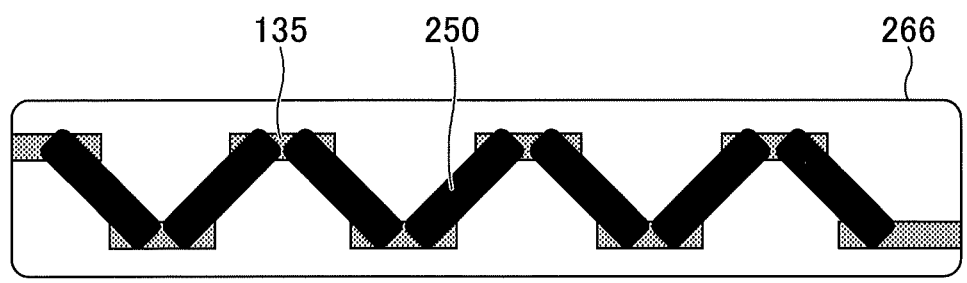
FIG. 24 is a diagram illustrating an example of an optical array according to some embodiment.

FIG. 24 is a diagram illustrating an optical array 266 according to a sixth embodiment. The optical array 266 according to the sixth embodiment is configured to arrange the optical modules 250 in a zigzag manner. The optical array 266 may have, for example, such a configuration.

Figure 25:
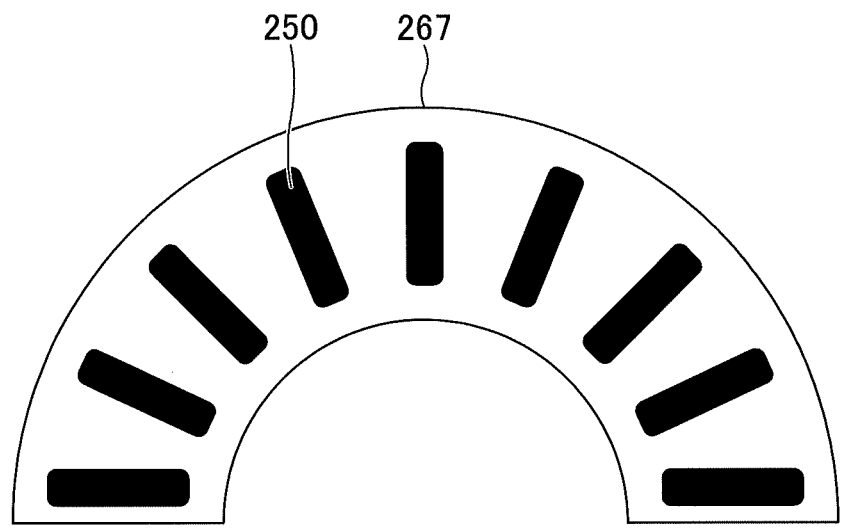
FIG. 25 is a diagram illustrating an example of an optical array according to some embodiment.

FIG. 25 is a diagram illustrating an optical array 267 according to a seventh embodiment. The optical array 267 according to the seventh embodiment is configured to have an arc-like shape and is configured to arrange the optical modules 250 radially as a whole along a radial direction of the optical module 267. The optical array 267 may have such a configuration, for example.

Figure 26:
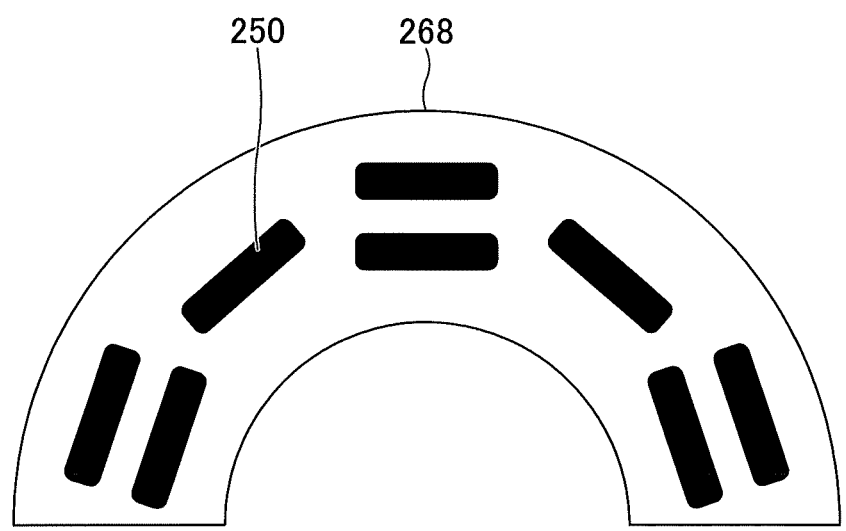
FIG. 26 is a diagram illustrating an example of an optical array according to some embodiment.

FIG. 26 is a diagram illustrating an optical array 268 according to an embodiment of an eighth embodiment. The optical array 278 according to the eighth embodiment is configured to have an arc-like shape and is configured to arrange the optical modules 250 in an arc-like manner as a whole along a circumferential direction of the optical module 268. The optical array 268 may have such a configuration, for example.

Working Example

Next, a working example of performing the method for manufacturing the module according to the second embodiment is described below. Similar to the second embodiment, a phosphor sheet 81 was formed as a first layer to a degree of not completely hardening; a barrier sheet 91 was formed as a second layer to a degree of not completely hardening; and a phosphor sheet with a barrier layer 100 was formed by finally completely hardening. Types of Silicon resin in the same system were used as a light transmissive resin 80 used for a phosphor sheet and as a light transmissive resin 90 used for a barrier sheet 91. In contrast, in a comparative example, only the phosphor sheet 82 was formed, and was fully hardened from the beginning. The silicone resin was used similarly to the light transmissive resin 80 of the working example.

Figure 27:
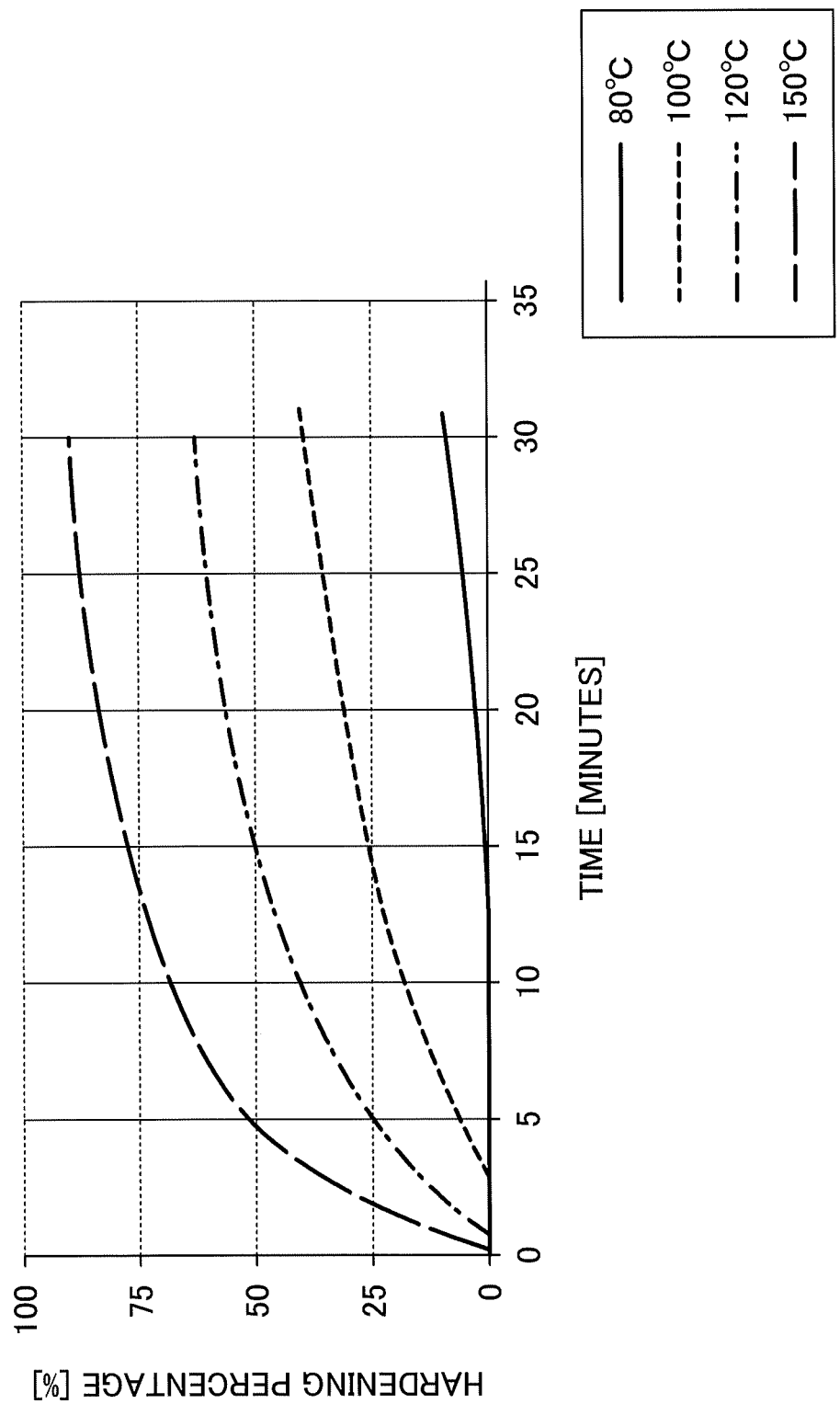
FIG. 27 is a diagram showing hardening percentage properties of a light transmissive resin used in an working example.

FIG. 27 is a diagram showing a hardening percentage properties of the light transmissive resin 80 used in the working example, which is silicone resin. In FIG. 27, the heating temperature was set at 120° C. in accordance with the hardening percentage properties at 120° C., and the working example and the comparative example were performed.

Figure 28:
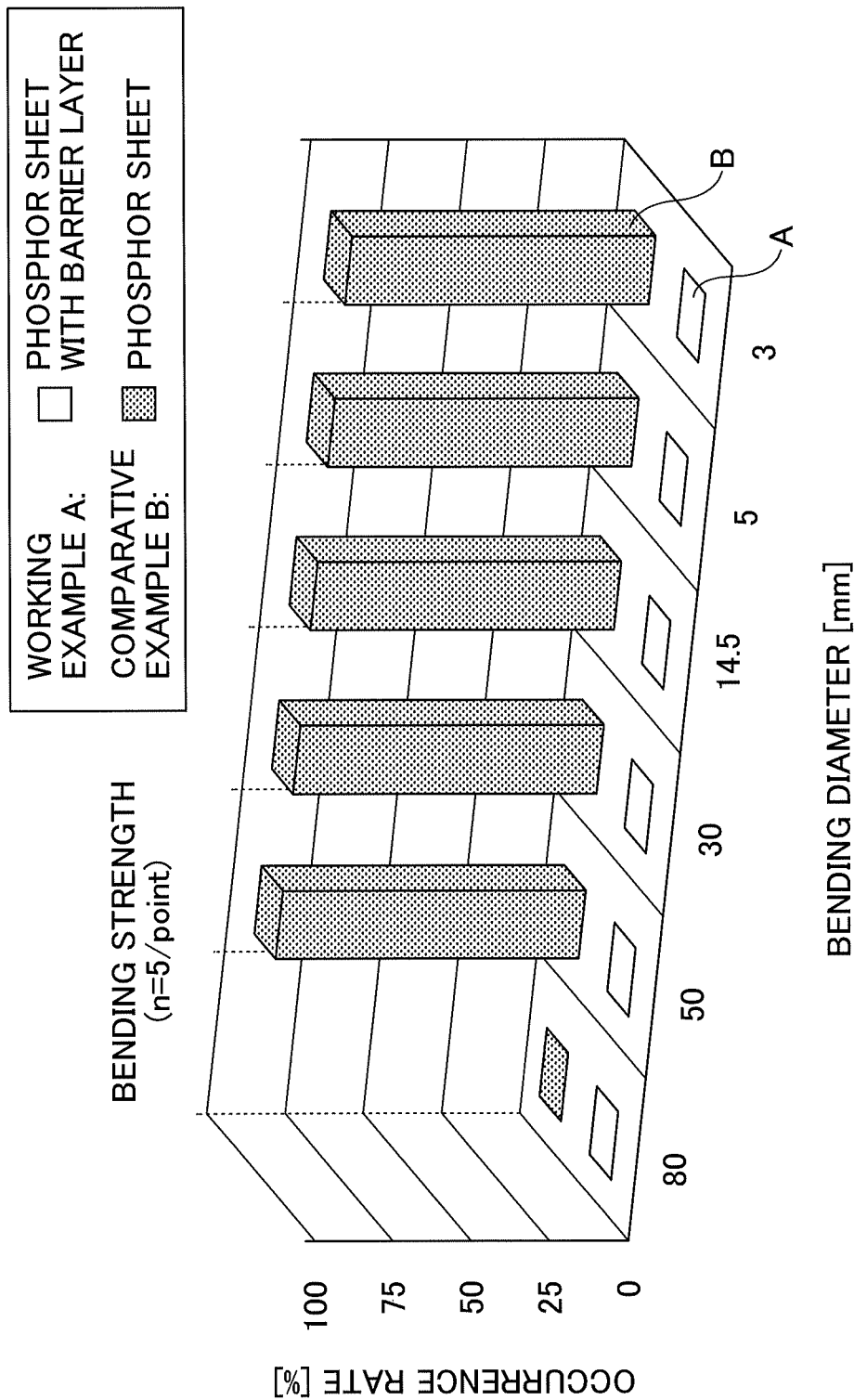
FIG. 28 is a diagram showing a result of a bending strength test of a module manufactured by methods for manufacturing modules according to a working example and a comparative example.

FIG. 28 is a diagram showing a result of a bending strength test of modules manufactured by methods for manufacturing a module of the working example and the comparative example. By bending a phosphor sheet with a barrier layer of the working example and a phosphor sheet of a comparative example so as to form an arc, an occurrence percentage of a breakage was examined. Here, the occurrence percentage of the breakage was measured at five points of each of the sheets.

As illustrated in FIG. 28, the occurrence percentage of the breakage was examined by changing a bending diameter, and the occurrence percentage of the breakage was zero in the phosphor sheet with the barrier layer of the working example at all diameters from 80 mm to 3 mm.

In contrast, with respect to the phosphor sheet of the comparative example, the occurrence percentage of the breakage was zero when the bending diameter was 80 mm, but all of the occurrence percentage became 100% and the breakage occurred when the bending diameter was 50 mm or less. This is because the phosphor sheet of the comparative example has too low flexibility, and the breakage occurs when a deformable stress is added.

In contrast, because the phosphor sheet with the barrier layer has flexibility, the phosphor sheet with the barrier layer does not break and can maintain the shape while being bent.

Thus, the present working example has indicated that the module manufactured by the method for manufacturing the module according to the present embodiment has sufficient flexibility, and its tolerance can be improved.

As discussed above, the embodiments of the present disclosure can improve flexibility of a module using resin.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A method for manufacturing a module including N layers of stacked resin, where N is a natural number of two or more, the method comprising steps of:
   curing resin of a first layer to a degree that does not fully harden the resin of the first layer;
   stacking resin of a Mth layer on resin of a (M−1)th layer, wherein M is a natural number of two or more and less than N;
   curing the resin of the Mth layer to a degree that does not fully harden the resin of the Mth layer;
   repeating the steps of stacking the resin of the Mth layer and curing the resin of the Mth layer; and
   stacking resin of Nth layer;
   fully hardening all of the N layers of stacked resin.

2. The method according to claim 1, wherein the step of curing the resin of the first layer comprises a step of curing the resin of the first layer to a degree that solidifies the resin of the first layer.

3. The method according to claim 2, wherein the degree that solidifies resin of the first layer is set at a hardening percentage in a range of 50 to 65%.

4. The method according to claim 1, wherein the step of curing the resin of the Mth layer to the degree that does not fully hardening the resin of the Mth layer comprises a step of curing the resin of the Mth layer to a degree of solidifying the resin of the Mth layer.

5. The method according to claim 4, wherein the degree of solidifying the resin of the Mth layer is set at a hardening percentage in a range of 50 to 65%.

6. The method according to claim 1, wherein the step of curing the resin of the Mth layer to the degree that does not fully hardening the resin of the Mth layer comprises a step of curing the resin of the Mth layer to a degree that does not fully hardening all of the stacked resin of the M layers.

7. The method according to claim 1, wherein the step of curing the resin of the Mth layer to the degree that does not fully hardening the resin of the Mth layer comprises a step of curing the resin of the Mth layer to a degree that curing all of the stacked resin of the M layers at a hardening percentage in a range of 50 to 95%.

8. The method according to claim 1, wherein the step of fully hardening all of the N layers of stacked resin comprises a step of hardening all of the N layers of stacked resin at a hardening percentage of more than 95%.

9. The method according to claim 1, wherein the all of the N layers of stacked resin belong to a same system of resin.

10. A method for manufacturing an optical module, comprising steps of:
    mounting a light emitting element on a surface of a substrate including a plurality of electrodes in a face down manner;
    sealing the mounting surface of the substrate containing the light emitting element with a first light transmissive resin into which a light wavelength conversion substance is mixed;
    covering a top surface of the first light transmissive resin with a second light transmissive resin;
    forming a groove that reaches a predetermined depth of the substrate from a top surface of the second light transmissive resin so as to surround the light emitting element;
    filing the groove with light reflective resin and covering a top surface of the second light transmissive resin with the light reflective resin;
    removing the light reflective resin covering the top surface of the second light reflective resin covering the top surface of the second light transmissive resin; and
    dicing the light reflective resin and the substrate along the light reflective resin so as to leave part of the light reflective resin such that the light reflective resin covers outer lateral surfaces, thereby separating the light emitting element,
    wherein the steps of sealing the mounting surface of the substrate containing the light emitting element with the first light transmissive resin, covering the top surface of the first light transmissive resin with the second light transmissive resin, and removing the light reflective resin comprises curing the first light transmissive resin, the second light transmissive resin, and the light reflective resin to a degree that does not fully hardening the first light transmissive resin, the second light transmissive resin, and the light reflective resin, and
    wherein a step of fully hardening the first light transmissive resin, the second light transmissive resin and the light reflective resin are provided between the steps of filing the groove with light reflective resin and dicing the light reflective resin.

11. The method according to claim 10, wherein the degree that does not fully hardening the first light transmissive resin, the second light transmissive resin, and the light reflective resin is a level of solidifying the first light transmissive resin, the second light transmissive resin, and the light reflective resin.

12. The method according to claim 11, wherein the level of solidifying the first light transmissive resin, the second light transmissive resin, and the light reflective resin is a level of curing the first light transmissive resin, the second light transmissive resin, and the light reflective resin at a hardening percentage in a range of 50 to 95%.

13. The method according to claim 10, wherein the step of fully hardening the first light transmissive resin, the second light transmissive resin and the light reflective resin is hardening the first light transmissive resin, the second light transmissive resin and the light reflective resin at a hardening percentage of more than 95%.

\* \* \* \* \*